(12) United States Patent
Nakayama et al.

(10) Patent No.: US 8,203,347 B2
(45) Date of Patent: Jun. 19, 2012

(54) DEVICE, METHOD, AND PROGRAM FOR DETERMINING ELEMENT, RECORDING MEDIUM, AND MEASUREMENT DEVICE

(75) Inventors: Yoshikazu Nakayama, Saitama (JP); Takao Kawahara, Gunma (JP); Masato Haruta, Saitama (JP)

(73) Assignee: Advantest Corporation, Tokyo (JP)

( * ) Notice: Subject to any disclaimer, the term of this patent is extended or adjusted under 35 U.S.C. 154(b) by 540 days.

(21) Appl. No.: 12/377,791

(22) PCT Filed: Aug. 24, 2007

(86) PCT No.: PCT/JP2007/066951
§ 371 (c)(1),
(2), (4) Date: May 6, 2009

(87) PCT Pub. No.: WO2008/026711
PCT Pub. Date: Mar. 6, 2008

(65) Prior Publication Data
US 2010/0042347 A1    Feb. 18, 2010

(30) Foreign Application Priority Data
Aug. 30, 2006  (JP) ................. 2006-234579

(51) Int. Cl.
*G01R 35/00* (2006.01)
*G01R 27/04* (2006.01)
*G01R 27/32* (2006.01)
*G01R 27/28* (2006.01)

(52) U.S. Cl. ............ 324/601; 324/638; 324/650

(58) Field of Classification Search .......... 324/601, 324/638, 650
See application file for complete search history.

(56) References Cited

U.S. PATENT DOCUMENTS 5,047,725 A * 9/1991 Strid et al. ............ 324/601
5,332,974 A   7/1994 Harkins et al.
(Continued)

FOREIGN PATENT DOCUMENTS
JP    11-038054 A    2/1999
(Continued)

OTHER PUBLICATIONS

English language Abstract of JP 11-038054 A (Feb. 12, 1999).
User's and Service Guide Agilent Technologies 85057B 2.4mm Verification Kit, Nov. 2005.

*Primary Examiner* — Amy He
(74) *Attorney, Agent, or Firm* — Greenblum & Bernstein, P.L.C.

(57) ABSTRACT

A reflection element determination device derives error factors in a first signal source and a second signal source based on measurement results of a signal in respective states in which reflection elements are respectively connected to the first signal source and the second signal source, and measurement results of a signal in a state in which the first signal source and the second signal source are connected with each other via a transmission element, derives transmission characteristics of the transmission element based on the measurement results of a signal in the state in which the first signal source and the second signal source are connected with each other via the transmission element and the derived error factors, and determines whether the reflection elements realize predetermined reflection states based on the derived transmission characteristics of the transmission element and transmission characteristics of the transmission element which have been known before the derivation, where the transmission characteristic of the transmission element in a direction from a first terminal to a second terminal, and the transmission characteristic of the transmission element in the opposite direction are equal to each other.

13 Claims, 23 Drawing Sheets

U.S. PATENT DOCUMENTS

| | | |
|---|---|---|
| 6,859,026 B2 | 2/2005 | Hsi et al. |
| 7,302,351 B2 | 11/2007 | Haruta et al. |
| 2005/0140377 A1 | 6/2005 | Komatsu |
| 2006/0005065 A1 | 1/2006 | Nakayama et al. |
| 2007/0029989 A1* | 2/2007 | Haruta et al. .............. 324/76.22 |
| 2007/0040561 A1* | 2/2007 | Kamitani .................... 324/601 |
| 2007/0143051 A1 | 6/2007 | Nakayama et al. |
| 2007/0222455 A1 | 9/2007 | Haruta et al. |

FOREIGN PATENT DOCUMENTS

| | | |
|---|---|---|
| JP | 2005-172728 | 6/2005 |
| TW | 555979 | 10/2003 |
| WO | 03/087856 A1 | 10/2003 |
| WO | 2006/001234 A1 | 1/2006 |

* cited by examiner

DEVICE, METHOD, AND PROGRAM FOR DETERMINING ELEMENT, RECORDING MEDIUM, AND MEASUREMENT DEVICE

TECHNICAL FIELD

The present invention relates to a calibration when circuit parameters (such as the S parameters) of a device under test (DUT) are measured.

BACKGROUND ART

Conventionally, there have been measured circuit parameters (such as the S parameters) of a device under test (DUT) (refer to Patent Document 1: Japanese Laid-Open Patent Publication No. H11-38054, for example).

Specifically, a signal is transmitted from a signal source to a receiving unit via the DUT. The signal is received by the receiving unit. It is possible to acquire the S parameters and frequency characteristics of the DUT by measuring the signal received by the receiving unit.

On this occasion, measurement system errors are generated in the measurement due to mismatching between a measurement system such as the signal source and the DUT, and the like. These measurement system errors include Ed: error caused by the direction of bridges, Er: error caused by frequency tracking, and Es: error caused by source matching.

On this occasion, it is possible to correct the errors according to Patent Document 1, for example. The correction in this way is referred to as calibration. A brief description will now be given of the calibration. Calibration kits are connected to the signal source to realize three types of states: open, short-circuit, and load (standard load Z0). In these states, a signal reflected from the respective calibration kits is acquired by a bridge to obtain three types of the S parameter corresponding to the three types of state. The three types of variable Ed, Er, and Es are acquired from the three types of the S parameter.

Moreover, a measurement-system error factor Et in the receiving unit can be acquired by directly connecting the signal source and the receiving unit, and measuring an S parameter of a signal received by the receiving unit (refer to Patent Document 2: WO 2003/087856 pamphlet, for example). It should be noted that a circuit element (a calibration kit) which realizes the direct-connection state is referred to as through.

The correction is carried out by employing the error factors Ed, Er, Es, and Et acquired in this way.

However, the error factors may not be correctly acquired due to a secular change in S parameters of calibration kits themselves (open, short-circuit, load, and through), and faulty characteristics of the calibration kits themselves (both are referred to as "fault of calibration kits"). It is thus necessary to check whether a fault has been generated in the calibration kits.

There is the following possible method for checking a fault in the calibration kits. First, the calibration kits are connected to the signal source, thereby obtaining the error factors Ed, Er, Es, and Et. Then, the signal from the signal source is transmitted to the receiving unit via a check path (S parameters of the check path are known). The signal is received by the receiving unit. The S parameters of the check path are acquired by measuring the signal received by the receiving unit, and correcting the signal based on error factors which have been acquired. The acquired S parameters of the check path and the known S parameters of the check path are compared with each other. As a result of the comparison, if both of them coincide with each other, it can be considered that the error factors can be correctly acquired, and a fault has not been generated in the calibration kits. On the other hand, as a result of the comparison, if both of them do not coincide with each other, it can be considered that the error factors cannot be correctly acquired, and a fault has been generated in the calibration kits.

However, the above-described method of checking a fault in the calibration kits requires the check path, which complicates the measuring system.

It is therefore an object of the present invention to easily check a fault in calibration kits in a measurement system.

DISCLOSURE OF THE INVENTION

According to the present invention, a first element determination device for determining a state of a reflection element in a signal generation system which includes (1) a first signal source and a second signal source which can receive and transmit a signal, (2) a reflection element which can be connected respectively to the first and second signal sources, and realizes a predetermined reflection state, and (3) a transmission element which includes a first terminal and a second terminal, and has a transmission characteristic for a direction from the first terminal to the second terminal and a transmission characteristic for a direction from the second terminal to the first terminal which are equal to each other, includes: an error factor deriving unit that derives error factors in the first signal source and the second signal source based on a measurement result of a signal in respective states in which the reflection element is respectively connected to the first signal source and the second signal source, and a measurement result of a signal in a state in which the first terminal and the second terminal of the transmission element are respectively connected to the first signal source and the second signal source; a transmission characteristic deriving unit that derives a transmission characteristic of the transmission element based on a measurement result of a signal in the state in which the first terminal and the second terminal of the transmission element are respectively connected to the first signal source and the second signal source and the derived error factors; and a reflection element state determination unit that determines whether the reflection element realizes the predetermined reflection state based on the derived transmission characteristic of the transmission element and a transmission characteristic of the transmission element known before the derivation carried out by the transmission characteristic deriving unit.

According to the above invention, a first element determination device for determining a state of a reflection element in a signal generation system which includes (1) a first signal source and a second signal source which can receive and transmit a signal, (2) a reflection element which can be connected respectively to the first and second signal sources, and realizes a predetermined reflection state, and (3) a transmission element which includes a first terminal and a second terminal, and has a transmission characteristic for a direction from the first terminal to the second terminal and a transmission characteristic for a direction from the second terminal to the first terminal which are equal to each other, can be provided.

An error factor deriving unit derives error factors in the first signal source and the second signal source based on a measurement result of a signal in respective states in which the reflection element is respectively connected to the first signal source and the second signal source, and a measurement result of a signal in a state in which the first terminal and the second terminal of the transmission element are respectively connected to the first signal source and the second signal source.

A transmission characteristic deriving unit derives a transmission characteristic of the transmission element based on a measurement result of a signal in the state in which the first terminal and the second terminal of the transmission element are respectively connected to the first signal source and the second signal source and the derived error factors.

A reflection element state determination unit determines whether the reflection element realizes the predetermined reflection state based on the derived transmission characteristic of the transmission element and a transmission characteristic of the transmission element known before the derivation carried out by the transmission characteristic deriving unit.

According to the present invention, a second element determination device for determining a state of a reflection element and a transmission element in a signal generation system which includes (1) a first signal source and a second signal source which can receive and transmit a signal, (2) a reflection element which can be connected respectively to the first and second signal sources, and realizes a predetermined reflection state, and (3) a transmission element which realizes a predetermined transmission state, includes a first terminal and a second terminal, and has a transmission characteristic for a direction from the first terminal to the second terminal and a transmission characteristic for a direction from the second terminal to the first terminal which are equal to each other, includes: an error factor deriving unit that derives error factors in the first signal source and the second signal source based on a measurement result of a signal in respective states in which the reflection element is respectively connected to the first signal source and the second signal source, and a measurement result of a signal in a state in which the first terminal and the second terminal of the transmission element are respectively connected to the first signal source and the second signal source; a transmission characteristic deriving unit that derives a transmission characteristic of the transmission element based on a measurement result of a signal in the state in which the first terminal and the second terminal of the transmission element are respectively connected to the first signal source and the second signal source and the derived error factors; and an element state determination unit that determines whether the reflection element realizes the predetermined reflection state and whether the transmission element realizes the predetermined transmission state based on the derived transmission characteristic of the transmission element and a transmission characteristic of the transmission element known before the derivation carried out by the transmission characteristic deriving unit.

According to the above invention, a second element determination device for determining a state of a reflection element and a transmission element in a signal generation system which includes (1) a first signal source and a second signal source which can receive and transmit a signal, (2) a reflection element which can be connected respectively to the first and second signal sources, and realizes a predetermined reflection state, and (3) a transmission element which realizes a predetermined transmission state, includes a first terminal and a second terminal, and has a transmission characteristic for a direction from the first terminal to the second terminal and a transmission characteristic for a direction from the second terminal to the first terminal which are equal to each other, can be provided.

An error factor deriving unit derives error factors in the first signal source and the second signal source based on a measurement result of a signal in respective states in which the reflection element is respectively connected to the first signal source and the second signal source, and a measurement result of a signal in a state in which the first terminal and the second terminal of the transmission element are respectively connected to the first signal source and the second signal source.

A transmission characteristic deriving unit derives a transmission characteristic of the transmission element based on a measurement result of a signal in the state in which the first terminal and the second terminal of the transmission element are respectively connected to the first signal source and the second signal source and the derived error factors.

An element state determination unit determines whether the reflection element realizes the predetermined reflection state and whether the transmission element realizes the predetermined transmission state based on the derived transmission characteristic of the transmission element and a transmission characteristic of the transmission element known before the derivation carried out by the transmission characteristic deriving unit.

According to the present invention, the measurement result of a signal in the respective states in which the reflection element is respectively connected to the first signal source and the second signal source may include: a result of a measurement of the signal before the signal is reflected by the reflection element, and a result of a measurement of the signal reflected by the reflection element.

According to the present invention, the reflection element may realize any of states including an open state, a short-circuit state, and a standard load state.

According to the present invention, the measurement result of a signal in the state in which the first terminal and the second terminal of the transmission element are respectively connected to the first signal source and the second signal source may include: a result of a measurement of the signal before the signal is transmitted by the transmission element, and a result a measurement of the signal transmitted by the transmission element.

According to the present invention, the error factor deriving unit may include: a first-signal-source-side error factor deriving unit that derives an error factor in the first signal source based on the measurement result of a signal in the state in which the reflection element is connected to the first signal source; a second-signal-source-side error factor deriving unit that derives an error factor in the second signal source based on the measurement result of a signal in the state in which the reflection element is connected to the second signal source; an error factor ratio deriving unit that derives an error factor ratio which is a ratio between a first transmission error factor upon transmission of a signal from the first signal source to the second signal source and a second transmission error factor upon transmission of a signal from the second signal source to the first signal source based on the measurement result of a signal in the state in which the first terminal and the second terminal of the transmission element are connected respectively to the first signal source and the second signal source; and a transmission error factor deriving unit that derives the first transmission error factor and the second transmission error factor based on the error factor in the first signal source, the error factor in the second signal source, and the error factor ratio.

According to the present invention, a calibration device includes: the element determination device according to the present invention; and the signal generation system.

According to the present invention, a measurement device measures a device under test based on, when the reflection element state determination unit of the first element determination device determines that the reflection element realizes the predetermined reflection state, the error factors in the first signal source and the second signal source derived based on the measurement result of a signal in respective states in which the reflection element is respectively connected to the first signal source and the second signal source, and the measurement result of a signal in the state in which the first terminal and the second terminal of the transmission element are respectively connected to the first signal source and the second signal source, and a measurement result of a signal in a state in which the first signal source and the second signal source are connected with each other via the device under test.

According to the present invention, a measurement device measures a device under test based on, when the element state determination unit of the second element determination device determines that the reflection element realizes the predetermined reflection state, and the transmission element realizes the predetermined transmission state, the error factors in the first signal source and the second signal source based on the measurement result of a signal in respective states in which the reflection element is respectively connected to the first signal source and the second signal source, and the measurement result of a signal in the state in which the first terminal and the second terminal of the transmission element are respectively connected to the first signal source and the second signal source, and a measurement result of a signal in a state in which the first signal source and the second signal source are connected with each other via the device under test.

According to the present invention, an element determination method for determining a state of a reflection element in a signal generation system which includes (1) a first signal source and a second signal source which can receive and transmit a signal, (2) a reflection element which can be connected respectively to the first and second signal sources, and realizes a predetermined reflection state, and (3) a transmission element which includes a first terminal and a second terminal, and has a transmission characteristic for a direction from the first terminal to the second terminal and a transmission characteristic for a direction from the second terminal to the first terminal which are equal to each other, includes: an error factor deriving step that derives error factors in the first signal source and the second signal source based on a measurement result of a signal in respective states in which the reflection element is respectively connected to the first signal source and the second signal source, and a measurement result of a signal in a state in which the first terminal and the second terminal of the transmission element are respectively connected to the first signal source and the second signal source; a transmission characteristic deriving step that derives a transmission characteristic of the transmission element based on a measurement result of a signal in the state in which the first terminal and the second terminal of the transmission element are respectively connected to the first signal source and the second signal source and the derived error factors; and a reflection element state determination step that determines whether the reflection element realizes the predetermined reflection state based on the derived transmission characteristic of the transmission element and a transmission characteristic of the transmission element known before the derivation carried out by the transmission characteristic deriving step.

The present invention is a program of instructions for execution by the computer to perform a element determination process for determining a state of a reflection element in a signal generation system which includes (1) a first signal source and a second signal source which can receive and transmit a signal, (2) a reflection element which can be connected respectively to the first and second signal sources, and realizes a predetermined reflection state, and (3) a transmission element which includes a first terminal and a second terminal, and has a transmission characteristic for a direction from the first terminal to the second terminal and a transmission characteristic for a direction from the second terminal to the first terminal which are equal to each other, the element determination process including: an error factor deriving step that derives error factors in the first signal source and the second signal source based on a measurement result of a signal in respective states in which the reflection element is respectively connected to the first signal source and the second signal source, and a measurement result of a signal in a state in which the first terminal and the second terminal of the transmission element are respectively connected to the first signal source and the second signal source; a transmission characteristic deriving step that derives a transmission characteristic of the transmission element based on a measurement result of a signal in the state in which the first terminal and the second terminal of the transmission element are respectively connected to the first signal source and the second signal source and the derived error factors; and a reflection element state determination step that determines whether the reflection element realizes the predetermined reflection state based on the derived transmission characteristic of the transmission element and a transmission characteristic of the transmission element known before the derivation carried out by the transmission characteristic deriving step.

The present invention is a computer-readable medium having a program of instructions for execution by the computer to perform a element determination process for determining a state of a reflection element in a signal generation system which includes (1) a first signal source and a second signal source which can receive and transmit a signal, (2) a reflection element which can be connected respectively to the first and second signal sources, and realizes a predetermined reflection state, and (3) a transmission element which includes a first terminal and a second terminal, and has a transmission characteristic for a direction from the first terminal to the second terminal and a transmission characteristic for a direction from the second terminal to the first terminal which are equal to each other, the element determination process including: an error factor deriving step that derives error factors in the first signal source and the second signal source based on a measurement result of a signal in respective states in which the reflection element is respectively connected to the first signal source and the second signal source, and a measurement result of a signal in a state in which the first terminal and the second terminal of the transmission element are respectively connected to the first signal source and the second signal source; a transmission characteristic deriving step that derives a transmission characteristic of the transmission element based on a measurement result of a signal in the state in which the first terminal and the second terminal of the transmission element are respectively connected to the first signal source and the second signal source and the derived error factors; and a reflection element state determination step that determines whether the reflection element realizes the predetermined reflection state based on the derived transmission characteristic of the transmission element and a transmission characteristic of the transmission element known before the derivation carried out by the transmission characteristic deriving step.

According to the present invention, an element determination method for determining a state of a reflection element and a transmission element in a signal generation system which includes (1) a first signal source and a second signal source which can receive and transmit a signal, (2) a reflection element which can be connected respectively to the first and second signal sources, and realizes a predetermined reflection state, and (3) a transmission element which realizes a predetermined transmission state, includes a first terminal and a second terminal, and has a transmission characteristic for a direction from the first terminal to the second terminal and a transmission characteristic for a direction from the second terminal to the first terminal which are equal to each other, includes: an error factor deriving step that derives error factors in the first signal source and the second signal source based on a measurement result of a signal in respective states in which the reflection element is respectively connected to the first signal source and the second signal source, and a measurement result of a signal in a state in which the first terminal and the second terminal of the transmission element are respectively connected to the first signal source and the second signal source; a transmission characteristic deriving step that derives a transmission characteristic of the transmission element based on a measurement result of a signal in the state in which the first terminal and the second terminal of the transmission element are respectively connected to the first signal source and the second signal source and the derived error factors; and an element state determination step that determines whether the reflection element realizes the predetermined reflection state and whether the transmission element realizes the predetermined transmission state based on the derived transmission characteristic of the transmission element and a transmission characteristic of the transmission element known before the derivation carried out by the transmission characteristic deriving step.

The present invention is a program of instructions for execution by the computer to perform a element determination process for determining a state of a reflection element and a transmission element in a signal generation system which includes (1) a first signal source and a second signal source which can receive and transmit a signal, (2) a reflection element which can be connected respectively to the first and second signal sources, and realizes a predetermined reflection state, and (3) a transmission element which realizes a predetermined transmission state, includes a first terminal and a second terminal, and has a transmission characteristic for a direction from the first terminal to the second terminal and a transmission characteristic for a direction from the second terminal to the first terminal which are equal to each other, the element determination process including: an error factor deriving step that derives error factors in the first signal source and the second signal source based on a measurement result of a signal in respective states in which the reflection element is respectively connected to the first signal source and the second signal source, and a measurement result of a signal in a state in which the first terminal and the second terminal of the transmission element are respectively connected to the first signal source and the second signal source; a transmission characteristic deriving step that derives a transmission characteristic of the transmission element based on a measurement result of a signal in the state in which the first terminal and the second terminal of the transmission element are respectively connected to the first signal source and the second signal source and the derived error factors; and an element state determination step that determines whether the reflection element realizes the predetermined reflection state and whether the transmission element realizes the predetermined transmission state based on the derived transmission characteristic of the transmission element and a transmission characteristic of the transmission element known before the derivation carried out by the transmission characteristic deriving step.

The present invention is a computer-readable medium having a program of instructions for execution by the computer to perform a element determination process for determining a state of a reflection element and a transmission element in a signal generation system which includes (1) a first signal source and a second signal source which can receive and transmit a signal, (2) a reflection element which can be connected respectively to the first and second signal sources, and realizes a predetermined reflection state, and (3) a transmission element which realizes a predetermined transmission state, includes a first terminal and a second terminal, and has a transmission characteristic for a direction from the first terminal to the second terminal and a transmission characteristic for a direction from the second terminal to the first terminal which are equal to each other, the element determination process including: an error factor deriving step that derives error factors in the first signal source and the second signal source based on a measurement result of a signal in respective states in which the reflection element is respectively connected to the first signal source and the second signal source, and a measurement result of a signal in a state in which the first terminal and the second terminal of the transmission element are respectively connected to the first signal source and the second signal source; a transmission characteristic deriving step that derives a transmission characteristic of the transmission element based on a measurement result of a signal in the state in which the first terminal and the second terminal of the transmission element are respectively connected to the first signal source and the second signal source and the derived error factors; and an element state determination step that determines whether the reflection element realizes the predetermined reflection state and whether the transmission element realizes the predetermined transmission state based on the derived transmission characteristic of the transmission element and a transmission characteristic of the transmission element known before the derivation carried out by the transmission characteristic deriving step.

BRIEF DESCRIPTION OF THE DRAWINGS

FIG. 6(c) shows a state in which the reflection element 41L is connected to the first signal source 10;

BEST MODE FOR CARRYING OUT THE INVENTION

A description will now be given of embodiments of the present invention with reference to drawings.

Figure 1:
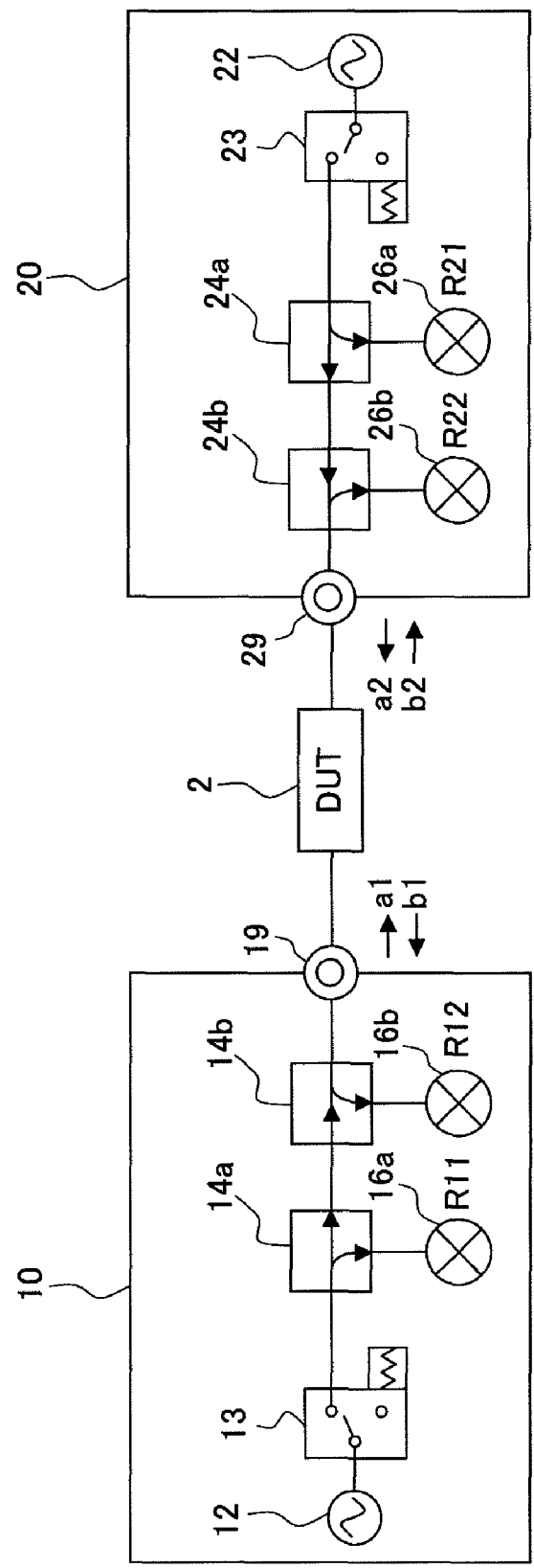
FIG. 1 is a diagram showing a configuration of a measurement system according to the embodiments of the present invention.

FIG. 1 is a diagram showing a configuration of a measurement system according to the embodiments of the present invention. The measurement system includes a first signal source 10 and a second signal source 20. To the first signal source 10 and the second signal source 20, a device under test (DUT) 2 is connected. It can be considered that the first signal source 10 and the second signal source 20 are connected with each other via the device under test 2.

The first signal source 10 includes a signal generation unit 12, a switch 13, bridges 14a and 14b, mixers 16a and 16b, and an output terminal 19.

The signal generation unit 12 generates a signal (such as a high frequency signal). The switch 13 receives the signal generated by the signal generation unit 12, and feeds the signal to the bridge 14a or a terminating resistor.

The bridge 14a receives the signal generated by the signal generation unit 12 via the switch 13, and branches the signal into two directions. The mixer 16a receives one of the outputs of the bridge 14a, and multiplies it by a local signal with a predetermined local frequency. It should be noted that the local signal is not illustrated. The output of the mixer 16a is denoted by R11.

The bridge 14b receives and directly outputs the other one of the outputs of the bridge 14a. It should be noted that the bridge 14b receives a signal coming from the output side, and supplies the mixer 16b with the signal. The mixer 16b multiplies the signal from the output side and a local signal by each other. It should be noted that the local signal is not illustrated. The output of the mixer 16b is denoted by R12.

The signal generated by the signal generation unit 12 is output from the output terminal 19. Moreover, another signal is input via the output terminal 19. On this occasion, an S parameter of the signal going out to the outside of the first signal source 10 from the output terminal 19 is denoted by a1, and an S parameter of the signal coming into the inside of the first signal source 10 via the output terminal 19 is denoted by b1.

The second signal source 20 includes a signal generation unit 22, a switch 23, bridges 24a and 24b, mixers 26a and 26b, and an output terminal 29.

The signal generation unit 22 generates a signal (such as a high frequency signal). The switch 23 receives the signal generated by the signal generation unit 22, and feeds the signal to the bridge 24a or a terminating resistor.

The bridge 24a receives the signal generated by the signal generation unit 22 via the switch 23, and branches the signal into two directions. The mixer 26a receives one of the outputs of the bridge 24a, and multiplies it by a local signal with a predetermined local frequency. It should be noted that the local signal is not illustrated. The output of the mixer 26a is denoted by R21.

The bridge 24b receives and directly outputs the other one of the outputs of the bridge 24a. It should be noted that the bridge 24b receives a signal coming from the output side, and supplies the mixer 26b with the signal. The mixer 26b multiplies the signal from the output side and a local signal by each other. It should be noted that the local signal is not illustrated. The output of the mixer 26b is denoted by R22.

The signal generated by the signal generation unit 22 is output from the output terminal 29. Moreover, another signal is input via the output terminal 29. On this occasion, an S parameter of the signal going out to the outside of the second signal source 20 from the output terminal 29 is denoted by a2, and an S parameter of the signal coming into the inside of the second signal source 20 via the output terminal 29 is denoted by b2.

If the switch 13 connects the signal generation unit 12 and the bridge 14a with each other, the switch 23 connects the signal generation unit 22 and the terminating resistor. As a result, the signal generated by the signal generation unit 12 is output from the output terminal 19, and the signal generated by the signal generation unit 12 is input to the second signal source 20 via the output terminal 29.

Moreover, if the switch 23 connects the signal generation unit 22 and the bridge 24a with each other, the switch 13 connects the signal generation unit 12 and the terminating resistor. As a result, the signal generated by the signal generation unit 22 is output from the output terminal 29, and the signal generated by the signal generation unit 22 is input to the first signal source 10 via the output terminal 19.

In this way, the first signal source 10 and the second signal source 20 can transmit and receive the signals.

Figure 2:
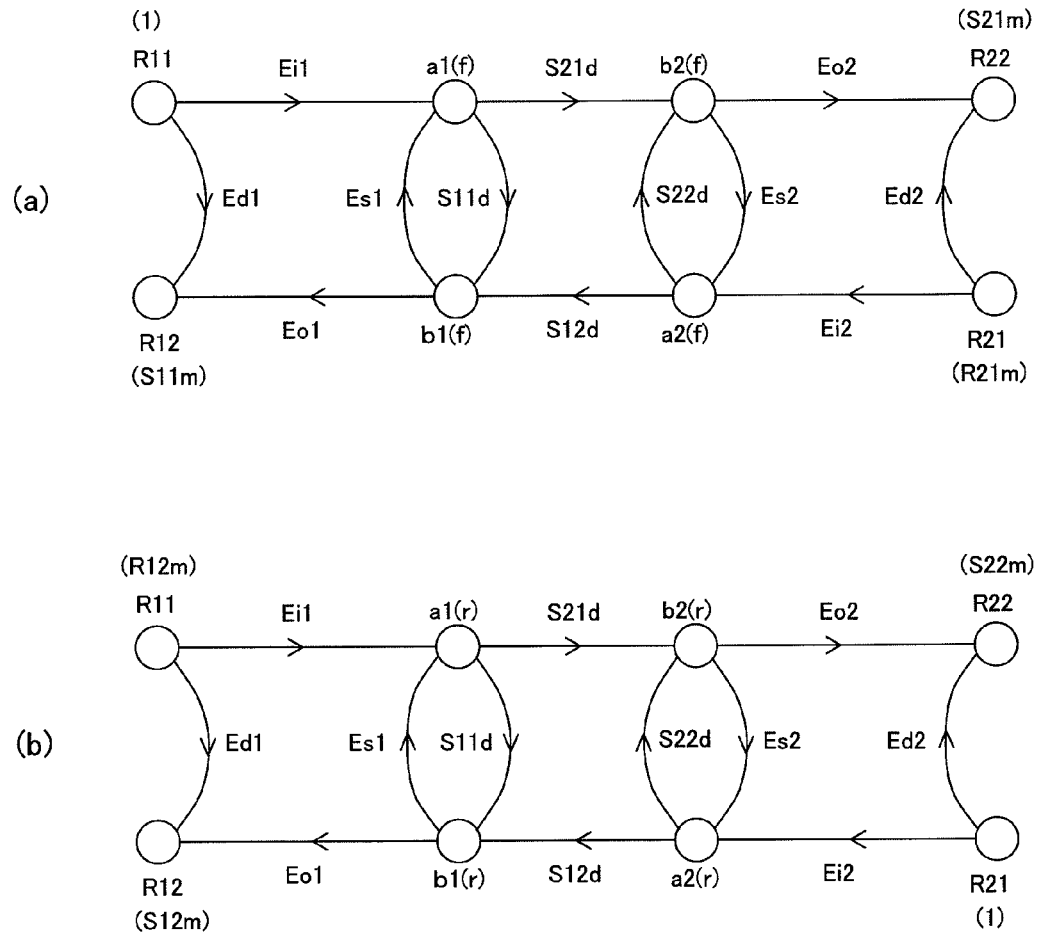
FIG. 2($a$) is a signal flow graph of the measurement system in the state in which the switch 13 connects the signal generation unit 12 and the bridge 14$a$ with each other (the signal is fed from the first signal source 10 to the second signal source 20), and FIG. 2($b$) is a signal flow graph of the measurement system in the state in which the switch 23 connects the signal generation unit 22 and the bridge 24$a$ with each other (the signal is fed from the second signal source 20 to the first signal source 10)

FIGS. 2(a) and 2(b) are signal flow graphs of the measurement system according to the embodiments of the present invention. FIG. 2(a) is a signal flow graph of the measurement system in the state in which the switch 13 connects the signal generation unit 12 and the bridge 14a with each other (the signal is fed from the first signal source 10 to the second signal source 20). FIG. 2(b) is a signal flow graph of the measurement system in the state in which the switch 23 connects the signal generation unit 22 and the bridge 24a with each other (the signal is fed from the second signal source 20 to the first signal source 10).

In FIGS. 2(a) and 2(b), Ed1, Es1, Ei1, and Eo1 are error factors of the first signal source 10, Ed2, Es2, Ei2, and Eo2 are error factors of the second signal source 20, and S11d, S12d, S21d, and S22d are S parameters of the device under test 2.

In FIG. 2(a), a1, b1, a2, and b2 are respectively denoted by a1(f), b1(f), a2(f), and b2(f), and in FIG. 2(b), a1, b1, a2, and b2 are respectively denoted by a1(r), b1(r), a2(r), and b2(r).

In FIG. 2(a), if R1 is 1, R22 is represented as R22/R11, R12 is represented as R12/R11, and R21 is represented as R21/R11. On this occasion, R22/R11 is denoted by S21m, R12/R11 is denoted by S11m, and R21/R11 is denoted by R21m. If the first signal source 10 and the second signal source 20 do not have the error factors, a relationship S21m=S21d holds, and a relationship S11m=S11d holds.

In FIG. 2(b), if R21 is 1, R22 is represented as R22/R21, R12 is represented as R12/R21, and R11 is represented as R11/R21. On this occasion, R22/R21 is denoted by S22m, R12/R21 is denoted by S12m, and R11/R21 is denoted by R12m. If the first signal source 10 and the second signal source 20 do not have the error factors, a relationship S12m=S12d holds, and a relationship S22m=S11d holds.

However, the first signal source 10 and the second signal source 20 actually have the error factors. Thus, in order to correctly acquire the S parameters of the device under test 2, it is necessary to take into account of the error factors of the first signal source 10 and the second signal source 20 in addition to R11, R22, R12, and R21.

It is thus necessary to acquire the error factors of the first signal source 10 and the second signal source 20.

First Embodiment

Figure 3:
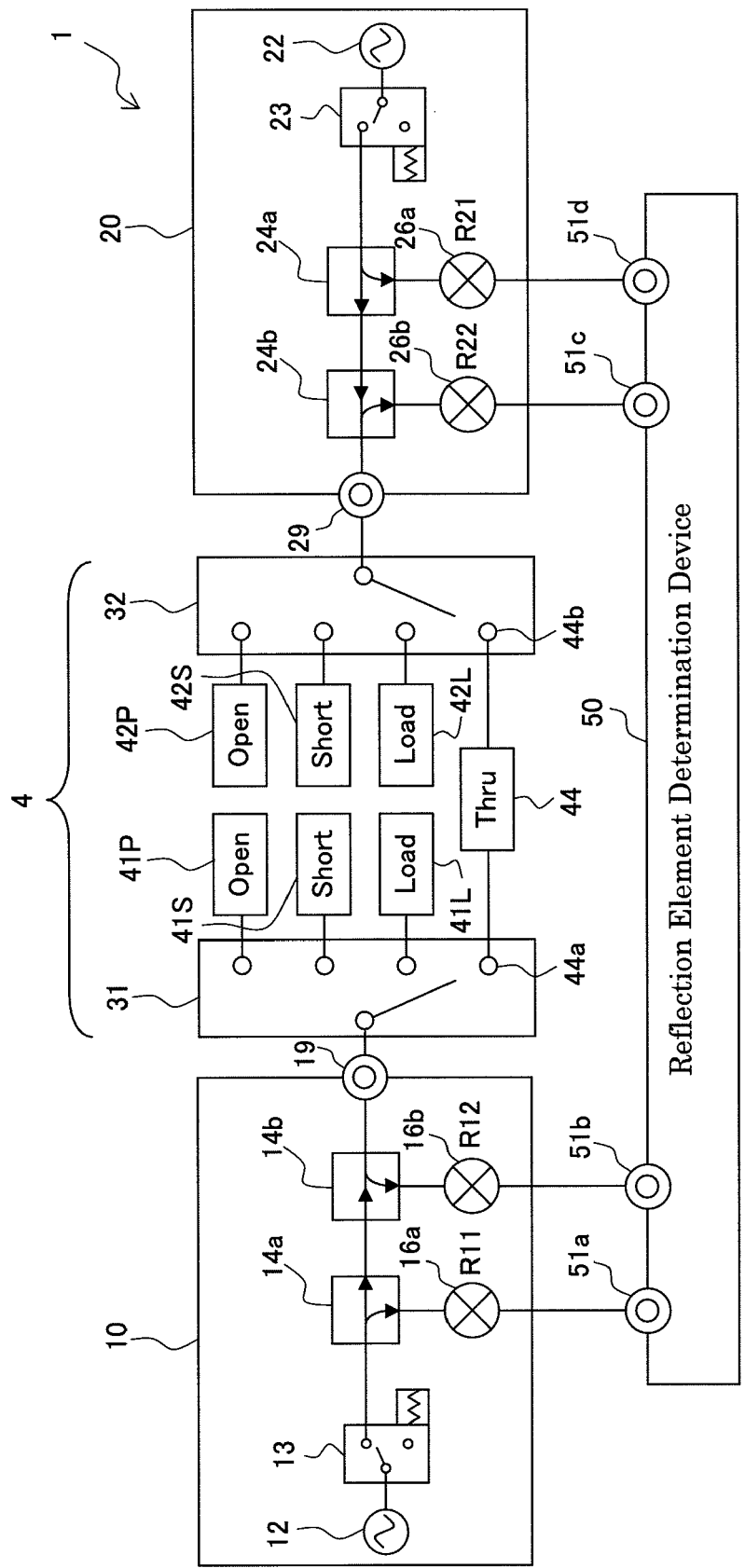
FIG. 3 shows a signal generation system 1 and a reflection element determination device 50 according to a first embodiment of the present invention.

FIG. 3 shows a signal generation system 1 and a reflection element determination device 50 according to a first embodiment of the present invention. It should be noted that the signal generation system 1 and the reflection element determination device 50 constitute a calibration device.

The signal generation system 1 includes the first signal source 10, the second signal source 20, and a device for calibration 4. The first signal source 10 and the second signal source 20 are exactly as described above, and can transmit and receive signals.

The device for calibration 4 includes switches 31 and 32, reflection elements 41P, 41S, 41L, 42P, 42S, and 42L, and a transmission element 44.

The switch 31 connects any one of the reflection elements 41P, 41S, and 41L and the transmission element 44 to the output terminal 19 of the first signal source 10. The switch 32 connects any one of the reflection elements 42P, 42S, and 42L and the transmission element 44 to the output terminal 29 of the second signal source 20.

The reflection elements 41P, 41S, and 41L realize predetermined reflection states. In other words, the reflection element 41P realizes a non-connection state (open), the reflection element 41S realizes a short-circuit state (short) (reflection coefficient: 1, total reflection), and the reflection element 41L includes a standard load (load) which realizes a state with zero of the reflection coefficient.

The reflection elements 42P, 42S, and 42L realize predetermined reflection states. In other words, the reflection element 42P realizes a non-connection state (open), the reflection element 42S realizes a short-circuit state (short) (reflection coefficient: 1, total reflection), and the reflection element 42L includes a standard load (load) which realizes a state with zero of the reflection coefficient.

Figure 16:
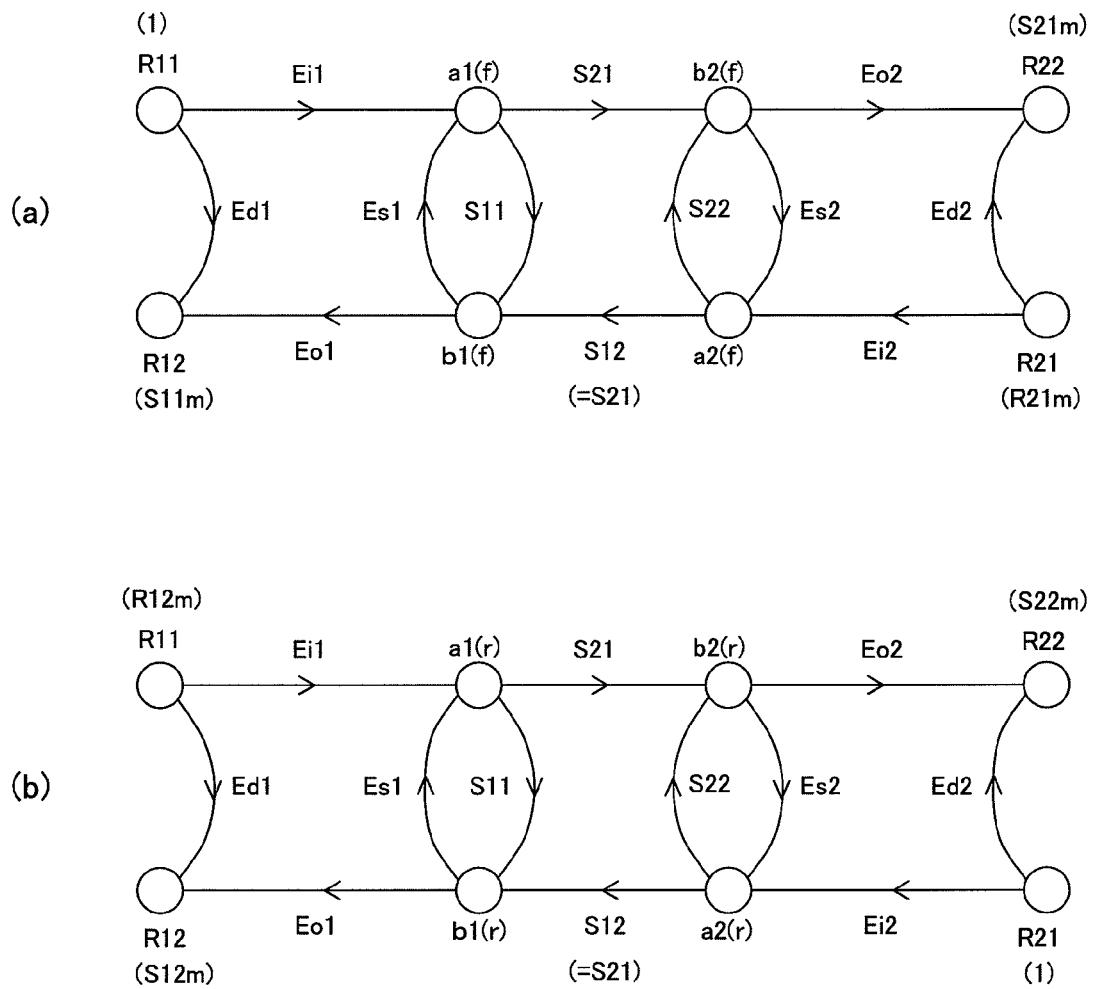
FIG. 16(a) is a signal flow graph representing the state in FIG. 14 (in which the signal is transmitted from the first signal source 10 to the second signal source 20)
FIG. 16(b) is a signal flow graph representing the state in FIG. 15 (in which the signal is transmitted from the second signal source 20 to the first signal source 10)

The transmission element 44 includes a first terminal 44a and a second terminal 44b. Moreover, a transmission characteristic (S21, refer to FIG. 16) in a direction from the first terminal 44a to the second terminal 44b and a transmission characteristic (S12, refer to FIG. 16) in a direction from the second terminal 44b to the first terminal 44a are equal to each other. Generally, the transmission element 44 is considered to satisfy a relationship: S21=S12. For example, this relationship is equivalent to a fact that when a voltage of −1V is impressed on a resistor through which a current of +1A flows when a voltage of +1V is impressed, a current of −1A flows.

It should be noted that the transmission characteristics of the transmission element 44 are represented as S11, S12, S21, and S22. The transmission characteristics S11, S12, S21, and S22 are known.

Preferably, the reflection elements 41P, 41S, 41L, 42P, 42S, and 42L always realize predetermined reflection states. However, due to a secular change and a faulty characteristic of the reflection elements, the reflection elements may not realize the predetermined reflection states. Thus, the reflection element determination device 50 determines whether the reflection elements are realizing the predetermined reflection states.

Figure 4:
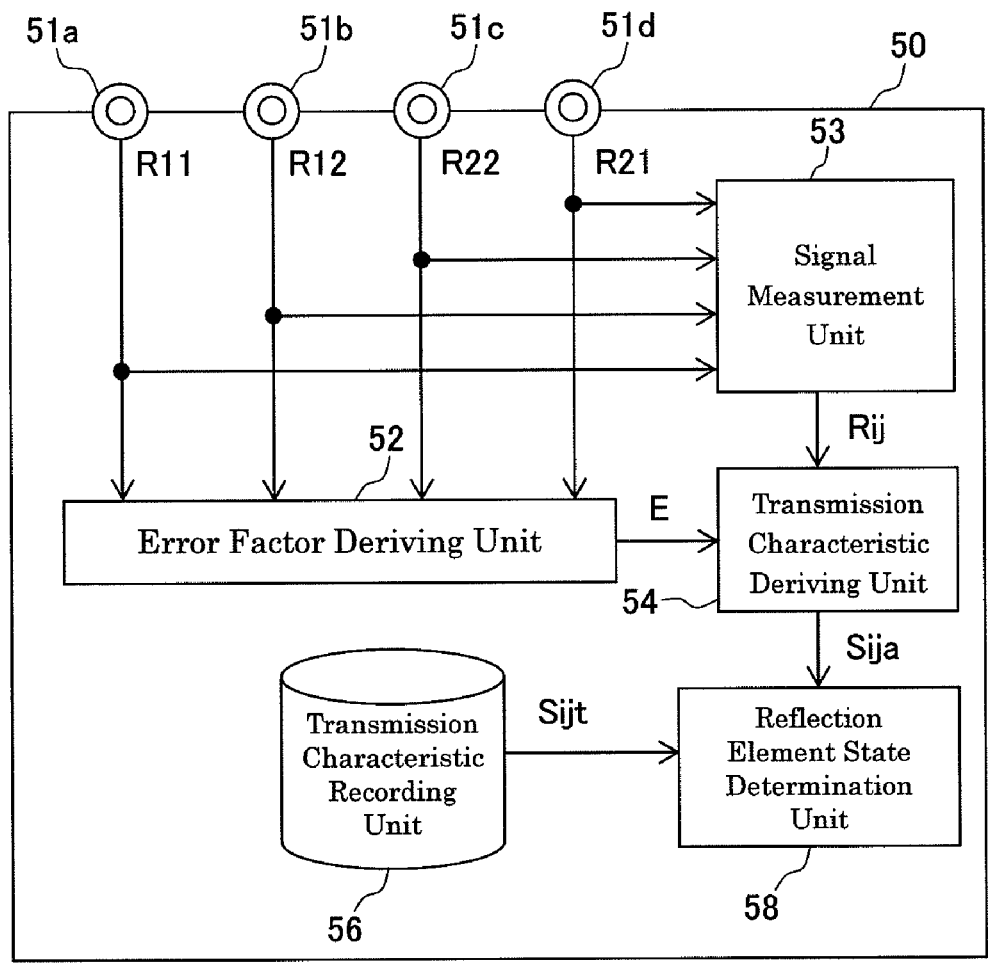
FIG. 4 is a functional block diagram showing a configuration of the reflection element determination device 50 according to the embodiment of the present invention.

FIG. 4 is a functional block diagram showing a configuration of the reflection element determination device 50 according to the embodiment of the present invention. The reflection element determination device 50 includes terminals 51a, 51b, 51c, and 51d, an error factor deriving unit 52, a signal measurement unit 53, a transmission characteristic deriving unit 54, a transmission characteristic recording unit 56, and a reflection element state determination unit 58.

The terminals 51a, 51b, 51c, and 51d are respectively connected to the mixers 16a, 16b, 26b, and 26a.

Figure 14:
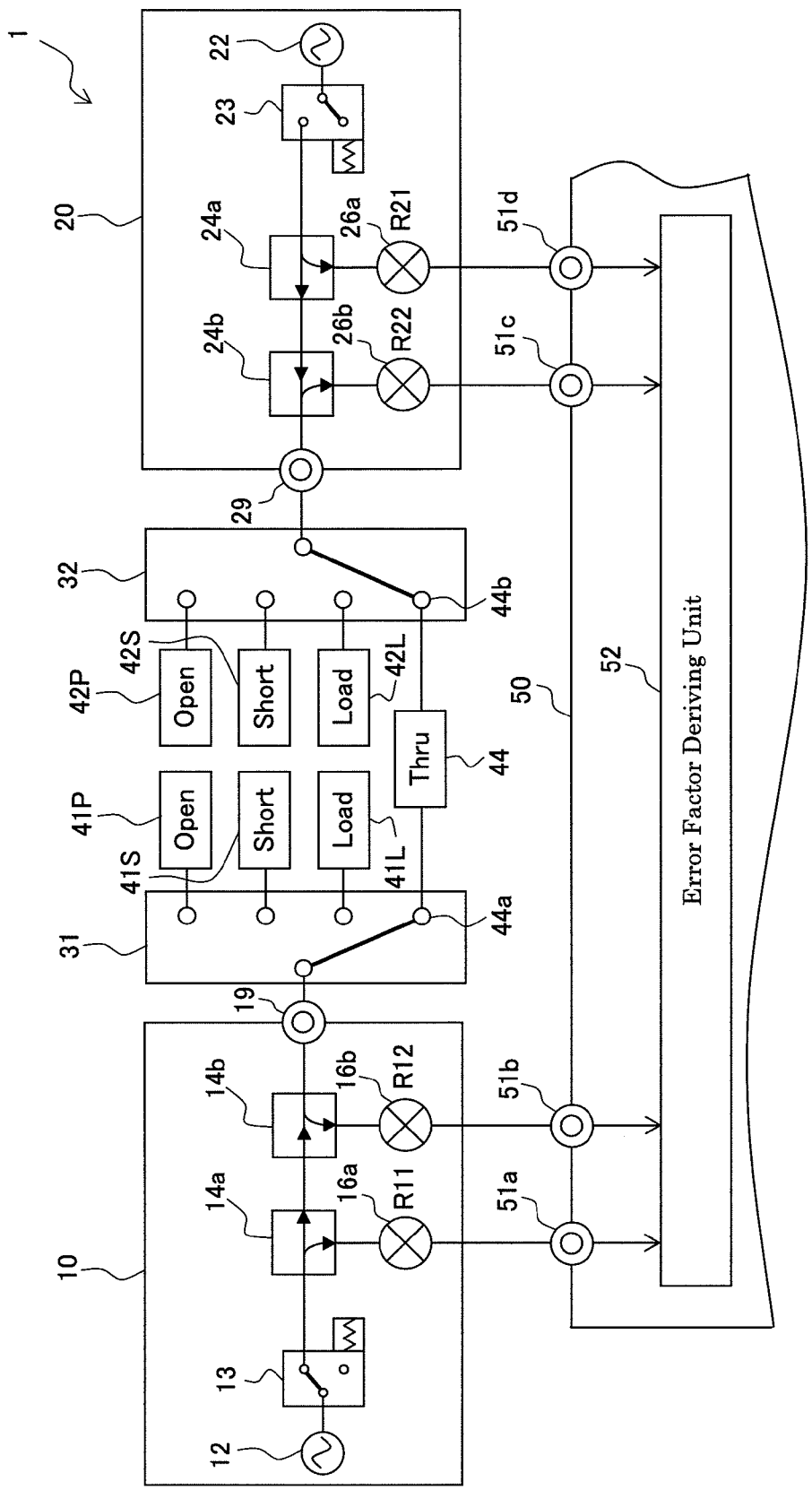
FIG. 14 shows the state in which the signal is transmitted from the first signal source 10 to the second signal source 20 when the first signal source 10 and the second signal source 20 are connected with each other via the transmission element 44.
Figure 15:
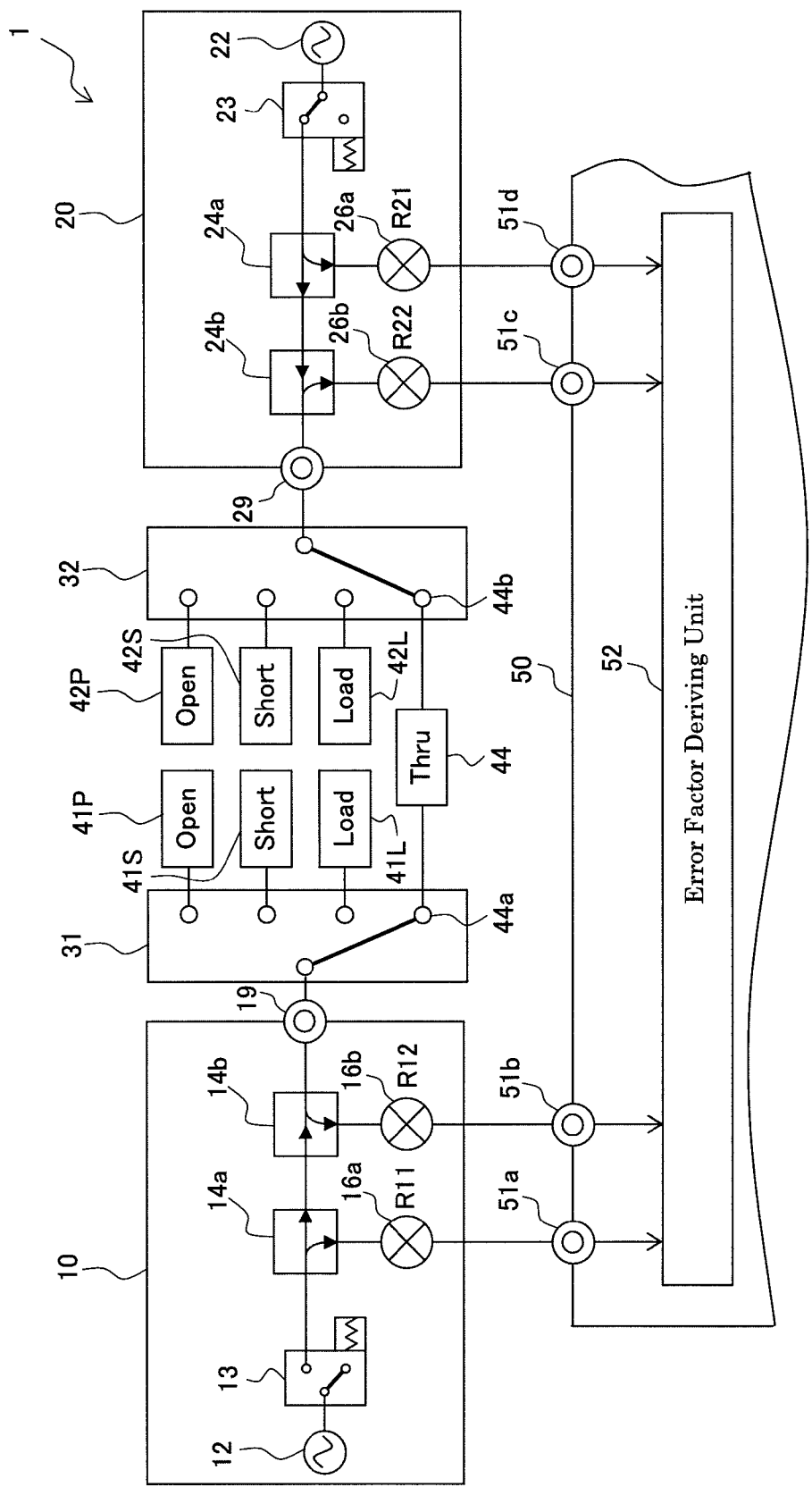
FIG. 15 shows the state in which the signal is transmitted from the second signal source 20 to the first signal source 10 when the first signal source 10 and the second signal source 20 are connected with each other via the transmission element 44.

The error factor deriving unit 52 derives the error factors of the first signal source 10 and the second signal source 20 based on measurement results of a signal in states in which the reflection elements 41P, 41S, 41L 42P, 42S, and 42L are respectively connected to the first signal source 10 and the second signal source 20, and measurement results of a signal in a state in which the first signal source 10 and the second signal source 20 are connected with each other via the transmission element 44 (the first terminal 44a is connected to the first signal source 10 by the switch 31, and the second terminal 44b is connected to the second signal source 20 by the switch 32 as shown in FIGS. 14 and 15).

Figure 5:
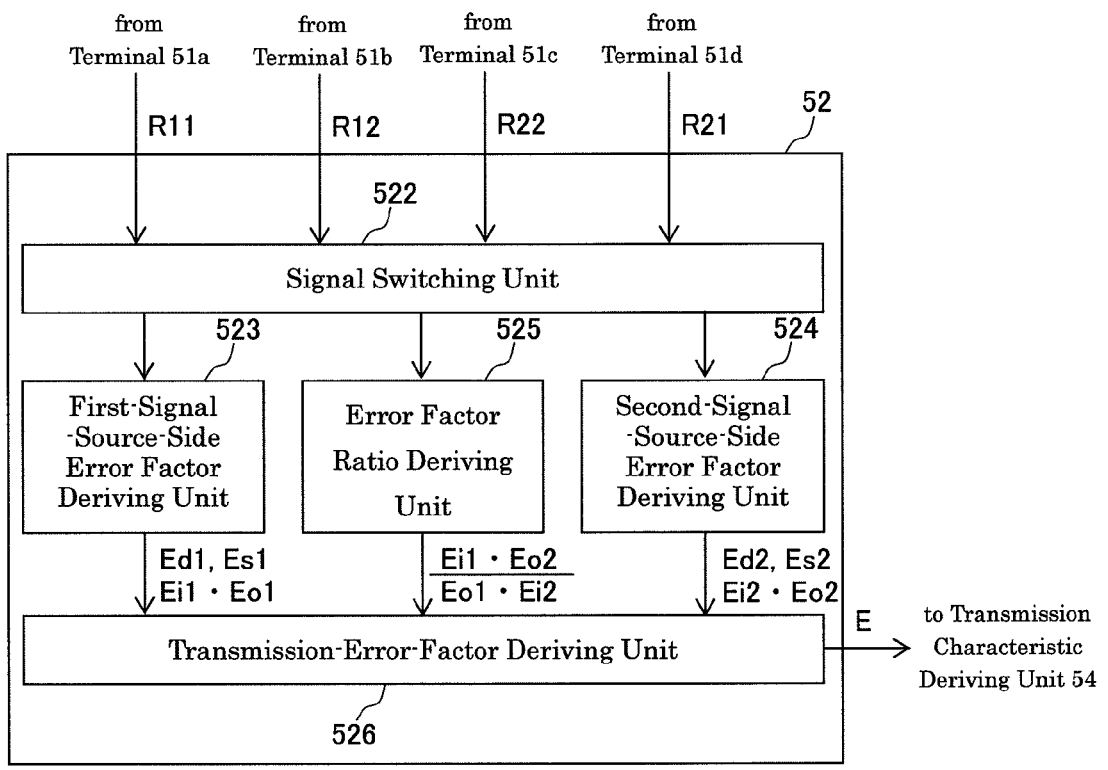
FIG. 5 is a functional block diagram showing a configuration of the error factor deriving unit 52.

FIG. 5 is a functional block diagram showing a configuration of the error factor deriving unit 52. The error factor deriving unit 52 includes a signal switching unit 522, a first-signal-source-side error factor deriving unit 523, a second-signal-source-side error factor deriving unit 524, an error factor ratio deriving unit 525, and a transmission-error-factor deriving unit 526.

The signal switching unit 522 feeds the signals R11, R12, R22, and R21 respectively received from the terminals 51a, 51b, 51c, and 51d to the first-signal-source-side error factor deriving unit 523, the second-signal-source-side error factor deriving unit 524, or the error factor ratio deriving unit 525.

The first-signal-source-side error factor deriving unit 523 derives the error factors Ed1, Es1, and Ei1·Eo1 in the first signal source 10 based on the measurement results of the signal in the states in which the reflection elements 41P, 41S, and 41L are respectively connected to the first signal source 10.

Figure 6:
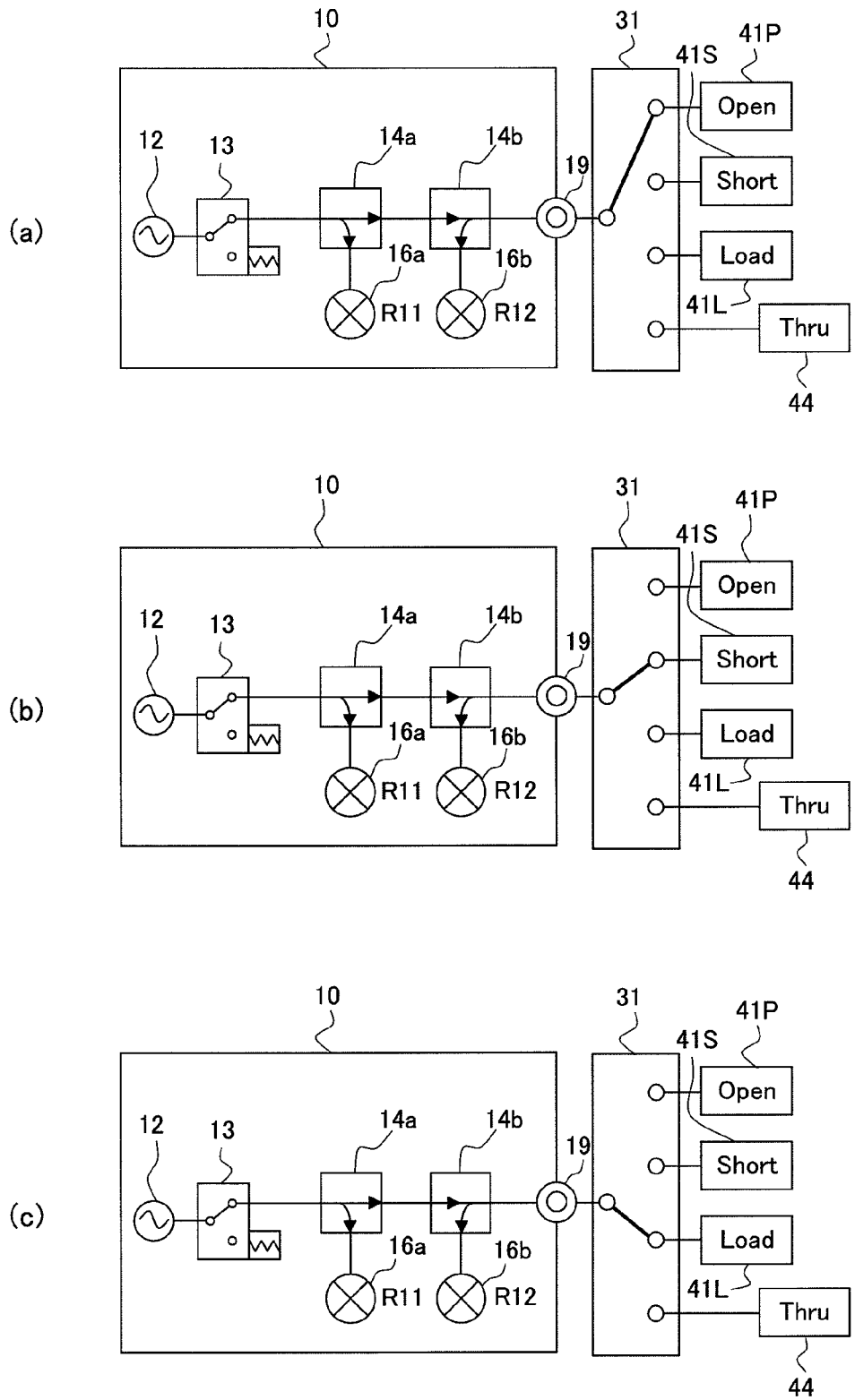
FIG. 6($a$) shows a state in which the reflection element 41P is connected to the first signal source 10, FIG. 6($b$) shows a state in which the reflection element 41S is connected to the first signal source 10.

FIG. 6(a) shows a state in which the reflection element 41P is connected to the first signal source 10, FIG. 6(b) shows a state in which the reflection element 41S is connected to the first signal source 10, and FIG. 6(c) shows a state in which the reflection element 41L is connected to the first signal source 10. It should be noted that components other than the first signal source 10, the switch 31, the reflection elements 41P, 41S, and 41L and the transmission element 44 are not illustrated.

The signal generated by the signal generation unit 12 is fed to the bridge 14a via the switch 13. The mixer 16a receives one of the outputs of the bridge 14a, and multiplies it by the local signal with the predetermined local frequency. The output R11 of the mixer 16a can be considered as a result of a measurement of the signal before the signal is reflected by the reflection element 41P, 41S, or 41L.

The bridge 14b receives and directly outputs the other one of the outputs of the bridge 14a. The output is fed to the reflection element 41P, 41S, or 41L from the output terminal 19, and is reflected by the reflection element 41P, 41S, or 41L. The reflected signal is fed to the bridge 14b via the output terminal 19. The bridge 14b feeds the signal fed via the output terminal 19 to the mixer 16b. The mixer 16b multiplies the signal fed via the output terminal 19 and the local signal by each other. The output R12 of the mixer 16b can be considered as a result of a measurement of the signal reflected by the reflection element 41P, 41S, or 41L.

Figure 7:
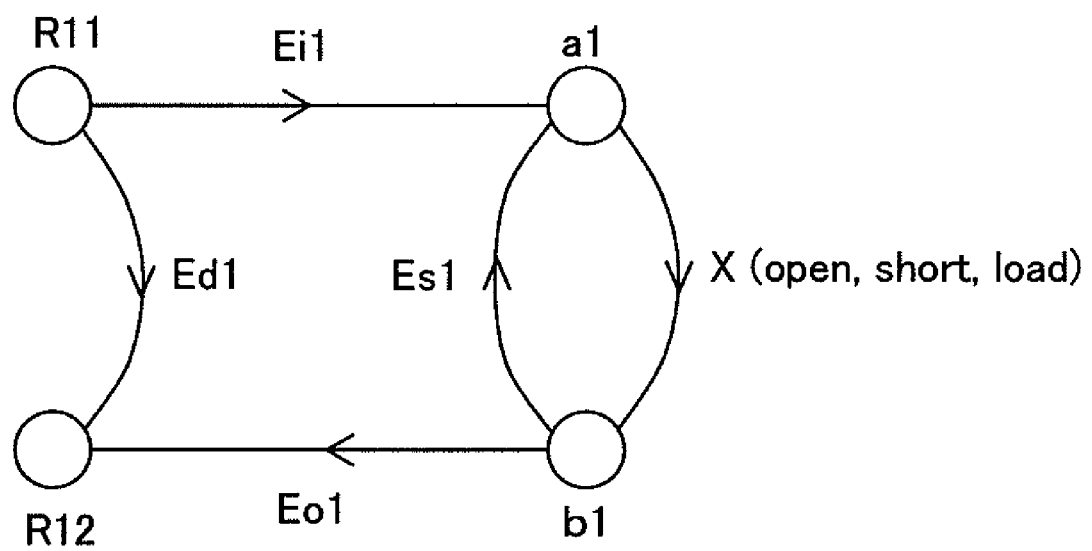
FIG. 7 is a signal flow graph representing the state in FIGS. 6(a) to 6(c)

FIG. 7 is a signal flow graph representing the state in FIGS. 6(a) to 6(c). It should be noted that X represents a load coefficient of the reflection element 41P (open), a load coefficient of the reflection element 41S (short-circuit), or a load coefficient of the reflection element 41L (load). In FIG. 7, it is considered that the following equation (1) holds:

$$R12/R11 = Ed1 + (Ei1 \cdot Eo1 \cdot X)/(1 - Es1 \cdot X) \quad (1)$$

Figure 8:
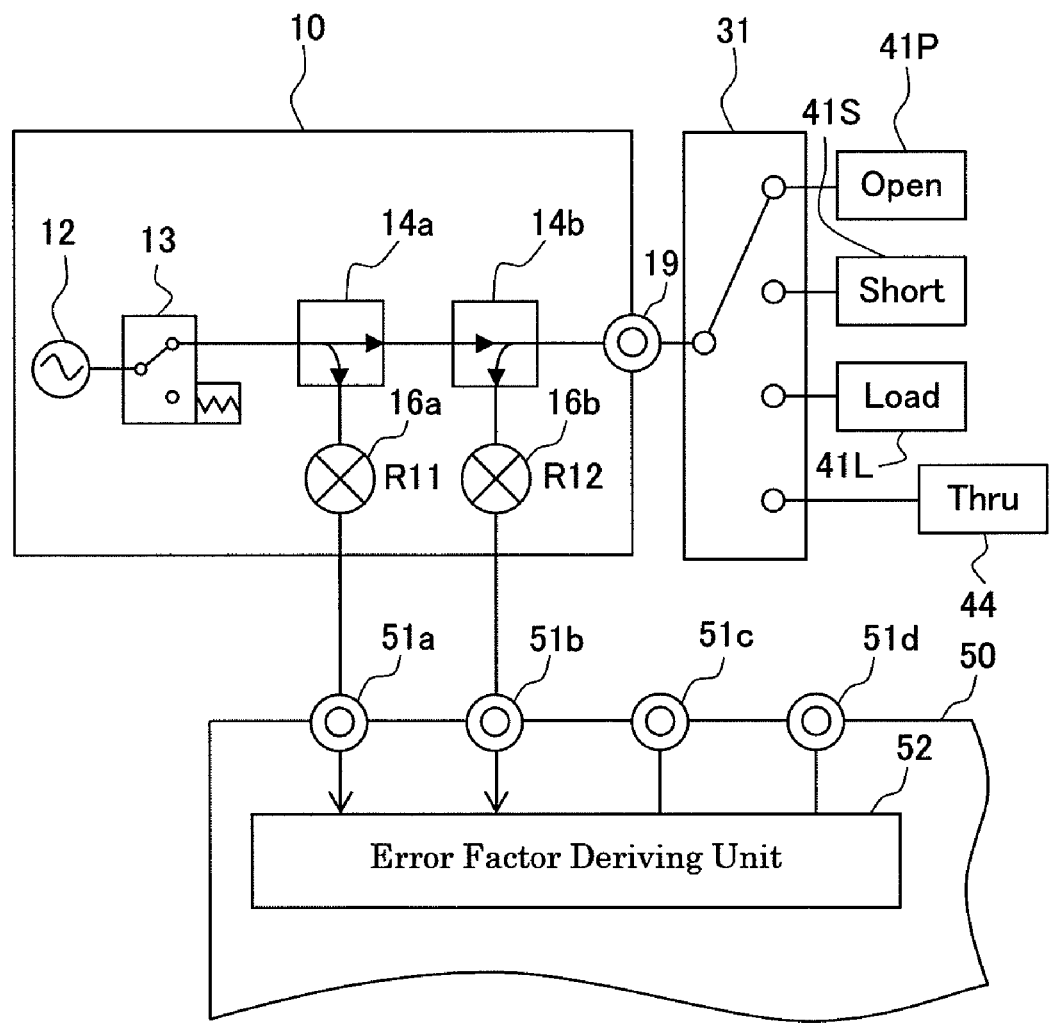
FIG. 8 shows a connection between the first signal source 10 and the reflection element determination device 50 in the state in which the reflection element 41P, 41S, or 41L is connected to the first signal source 10.

FIG. 8 shows a connection between the first signal source 10 and the reflection element determination device 50 in the state in which the reflection element 41P, 41S, or 41L is connected to the first signal source 10. Though the first signal source 10 is connected to the reflection element 41P in FIG. 8, the first signal source 10 may be connected to the reflection element 41S or the reflection element 41L. The terminals 51a and 51b are respectively connected to the mixers 16a and 16b, and receive R11 and R12. On this occasion, the terminals 51c and 51d may not be connected to the mixers 26b and 26a. However, the terminals 51c and 51d may be connected to the mixers 26b and 26a. On this occasion, the signals from the mixers 26b and 26a are not fed to the terminals 51c and 51d.

Figure 9:
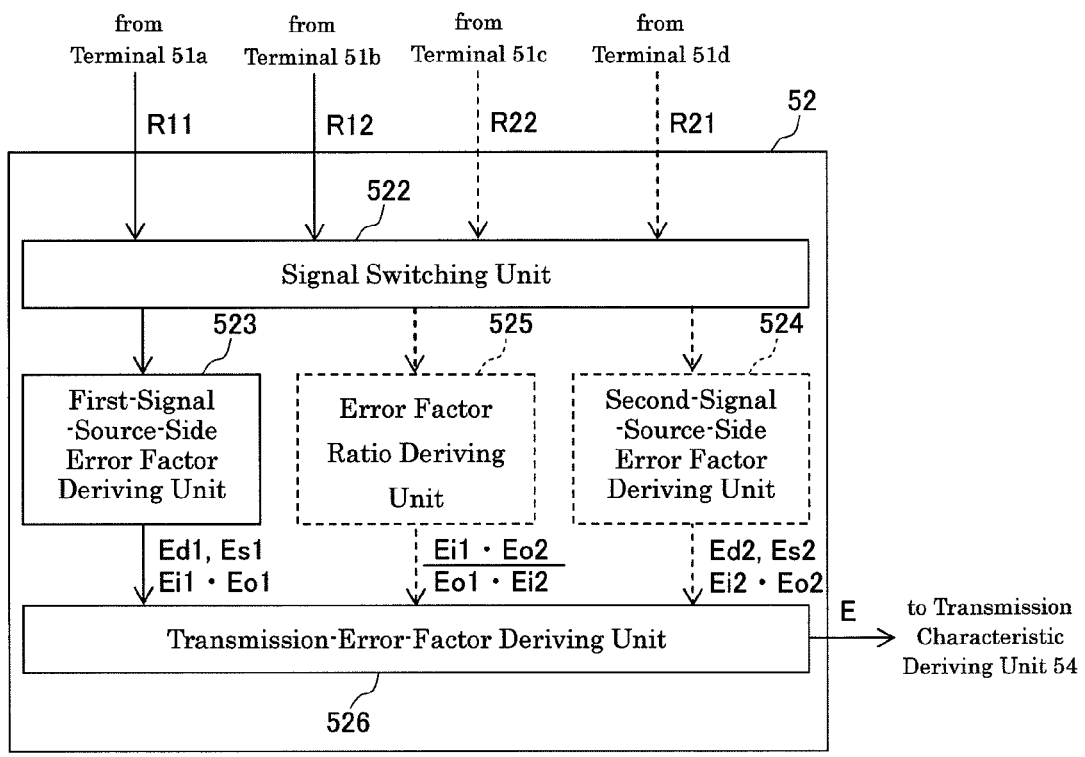
FIG. 9 shows an operation of the error factor deriving unit 52 in the state in which the reflection element 41P, 41S, or 41L is connected to the first signal source 10.

FIG. 9 shows an operation of the error factor deriving unit 52 in the state in which the reflection element 41P, 41S, or 41L is connected to the first signal source 10. In FIG. 9, components which are inactive are represented by dotted lines.

The signal switching unit 522 receives R11 and R12 respectively from the terminals 51a and 51b. It should be noted that the signal switching unit 522 does not receive signals from the terminals 51c and 51d. The signal switching unit 522 feeds R11 and R12 to the first-signal-source-side error factor deriving unit 523. The signal switching unit 522 feeds signals to neither the second-signal-source-side error factor deriving unit 524 nor the error-factor-ratio deriving unit 525. It should be noted that R11 and R12 can be considered as results of a measurement of the signal in the state in which the reflection element 41P, 41S or 41L is connected to the first signal source 10.

The first-signal-source-side error factor deriving unit 523 derives Ed1, Es1, and Ei1·Eo1 by assigning R11 (the result of the measurement of the signal before the signal is reflected by the reflection element 41P, 41S, or 41L), R12 (the result of the measurement of the signal reflected by the reflection element 41P, 41S, or 41L), and X (the load coefficient of the reflection element 41P (open), the load coefficient of the reflection element 41S (short-circuit), or the load coefficient of the reflection element 41L (load)) to the equation (1).

Ed1, Es1, and Ei1·Eo1 derived by the first-signal-source-side error factor deriving unit 523 are fed to the transmission-error-factor deriving unit 526.

The second-signal-source-side error factor deriving unit 524 derives the error factors Ed2, Es2, and Ei2·Eo2 in the second signal source 20 based on the measurement results of the signal in the state in which the reflection element 42P, 42S, or 42L is connected to the second signal source 20.

FIG. 10(a) shows the state in which the reflection element 42P is connected to the second signal source 20, FIG. 10(b) shows the state in which the reflection element 42S is connected to the second signal source 20, and FIG. 10(c) shows the state in which the reflection element 42L is connected to the second signal source 20. It should be noted that components other than the second signal source 20, the switch 32, the reflection elements 42P, 42S, and 42L and the transmission element 44 are not illustrated.

The signal generated by the signal generation unit 22 is fed to the bridge 24a via the switch 23. The mixer 26a receives one of the outputs of the bridge 24a, and multiplies it by the local signal with the predetermined local frequency. The output R21 of the mixer 26a can be considered as a result of a measurement of the signal before the signal is reflected by the reflection element 42P, 42S, or 42L.

The bridge 24b receives and directly outputs the other one of the outputs of the bridge 24a. The output is fed to the reflection element 42P, 42S, or 42L from the output terminal 29, and is reflected by the reflection element 42P, 42S, or 42L. The reflected signal is fed to the bridge 24b via the output terminal 29. The bridge 24b feeds the signal fed via the output terminal 29 to the mixer 26b. The mixer 26b multiplies the signal fed via the output terminal 29 and the local signal by each other. The output R22 of the mixer 26b can be considered as a result of a measurement of the signal reflected by the reflection element 42P, 42S, or 42L.

Figure 10:
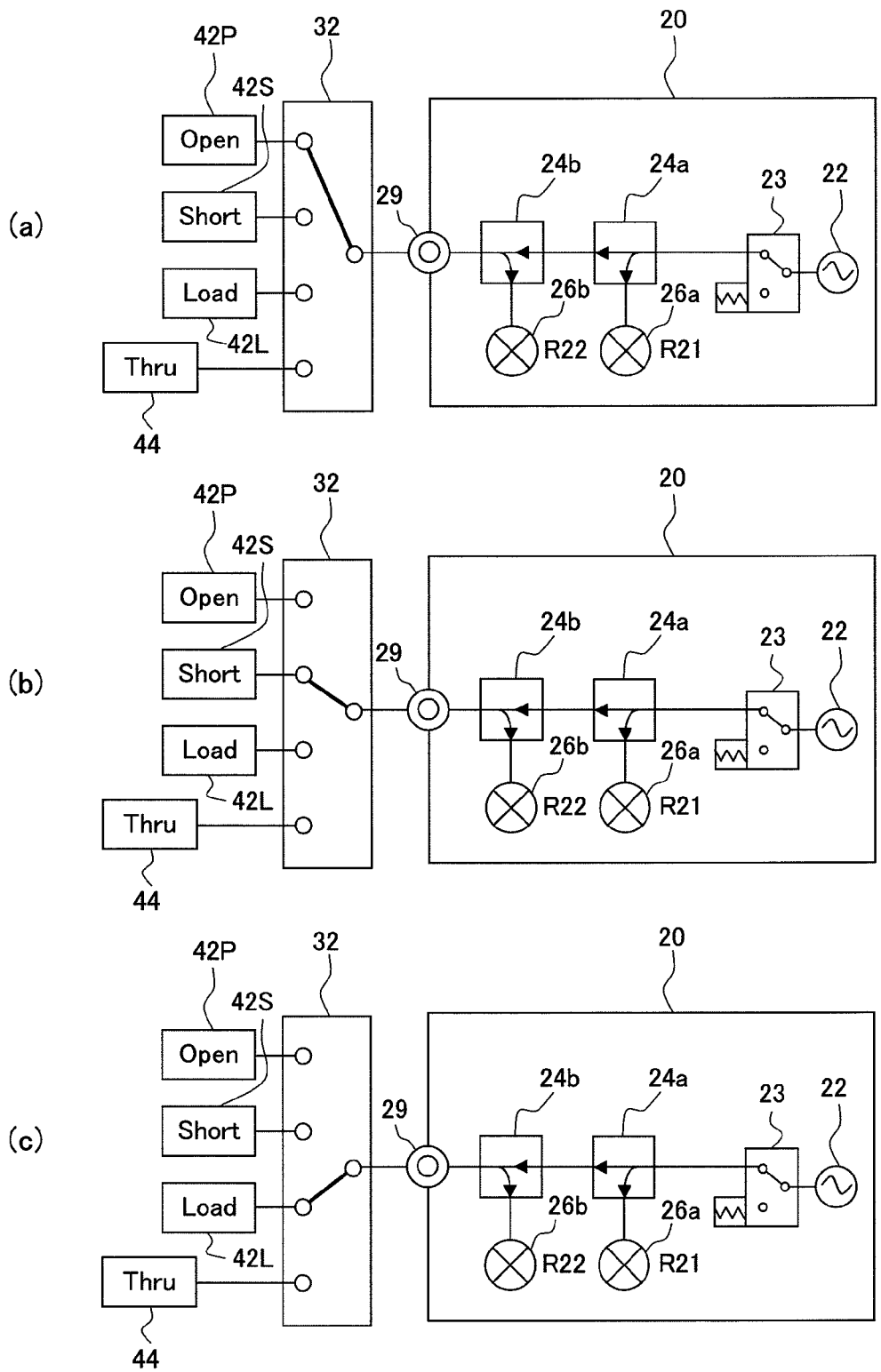
FIG. 10(a) shows the state in which the reflection element 42P is connected to the second signal source 20.
FIG. 10(b) shows the state in which the reflection element 42S is connected to the second signal source 20.
FIG. 10(c) shows the state in which the reflection element 42L is connected to the second signal source 20.
Figure 11:
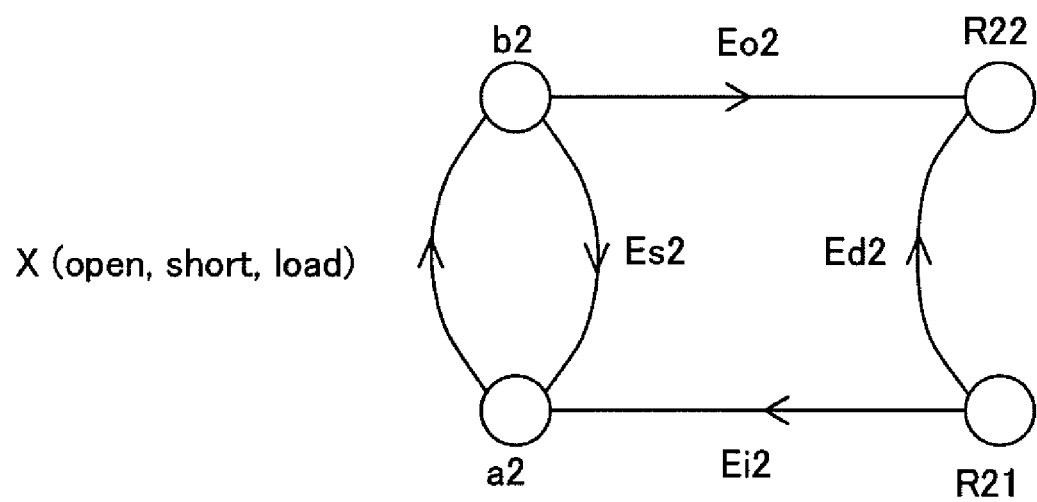
FIG. 11 is a signal flow graph representing the state in FIG. 10.

FIG. 11 is a signal flow graph representing the state in FIG. 10. It should be noted that X represents a load coefficient of the reflection element 42P (open), a load coefficient of the reflection element 42S (short-circuit), or a load coefficient of the reflection element 42L (load). In FIG. 10, it is considered that the following equation (2) holds:

$$R22/R21 = Ed2 + (Ei2 \cdot Eo2 \cdot X)/(1 - Es2 \cdot X) \qquad (2)$$

Figure 12:
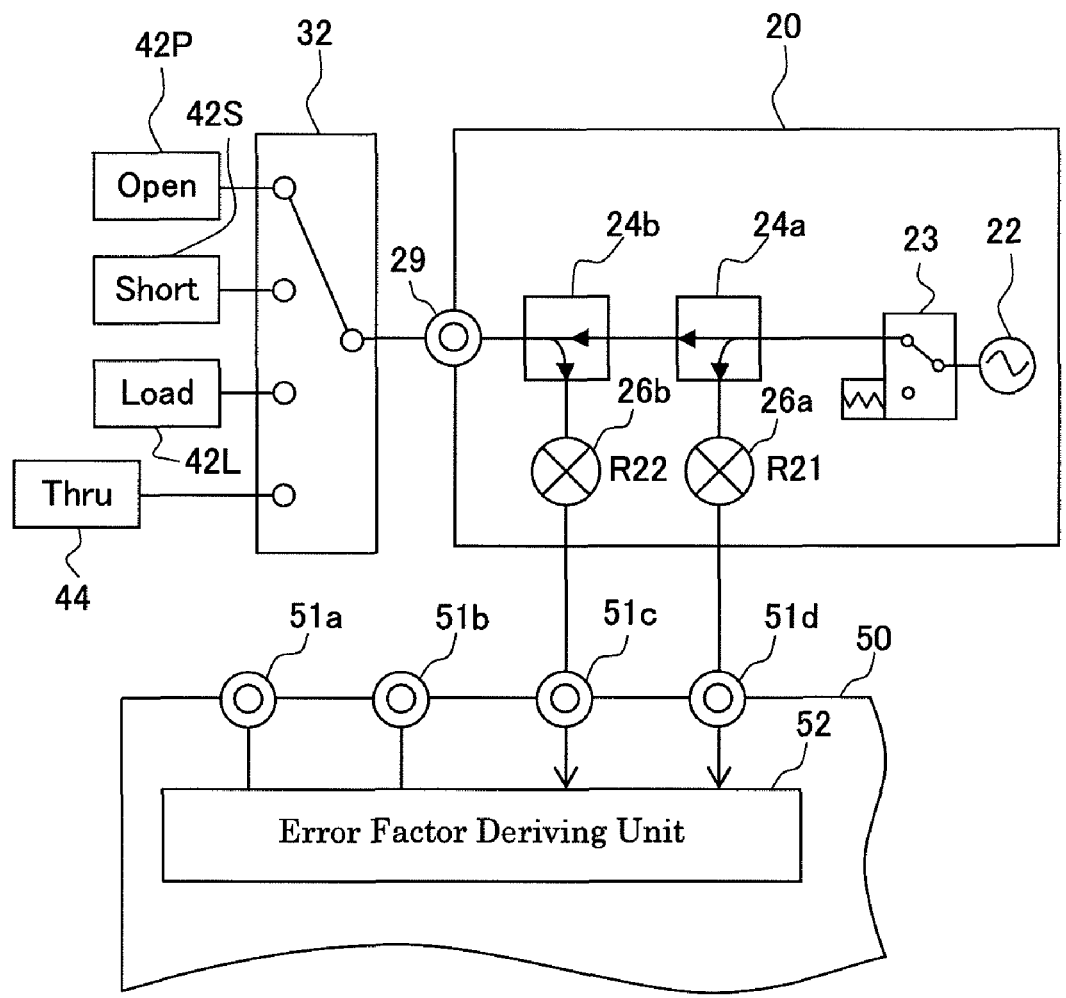
FIG. 12 shows a connection between the second signal source 20 and the reflection element determination device 50 in the state in which the reflection element 42P, 42S, or 42L is connected to the second signal source 20.

FIG. 12 shows a connection between the second signal source 20 and the reflection element determination device 50 in the state in which the reflection element 42P, 42S, or 42L is connected to the second signal source 20. Though the second signal source 20 is connected to the reflection element 42P in FIG. 12, the second signal source 20 may be connected to the reflection element 42S or the reflection element 42L. The terminals 51c and 51d are respectively connected to the mixers 26a and 26b, and receive R22 and R21. On this occasion, the terminals 51a and 51b may not be connected to the mixers 16a and 16b. However, the terminals 51a and 51b may be connected to the mixers 16a and 16b. On this occasion, the signals from the mixers 16a and 16b are not fed to the terminals 51a and 51b.

Figure 13:
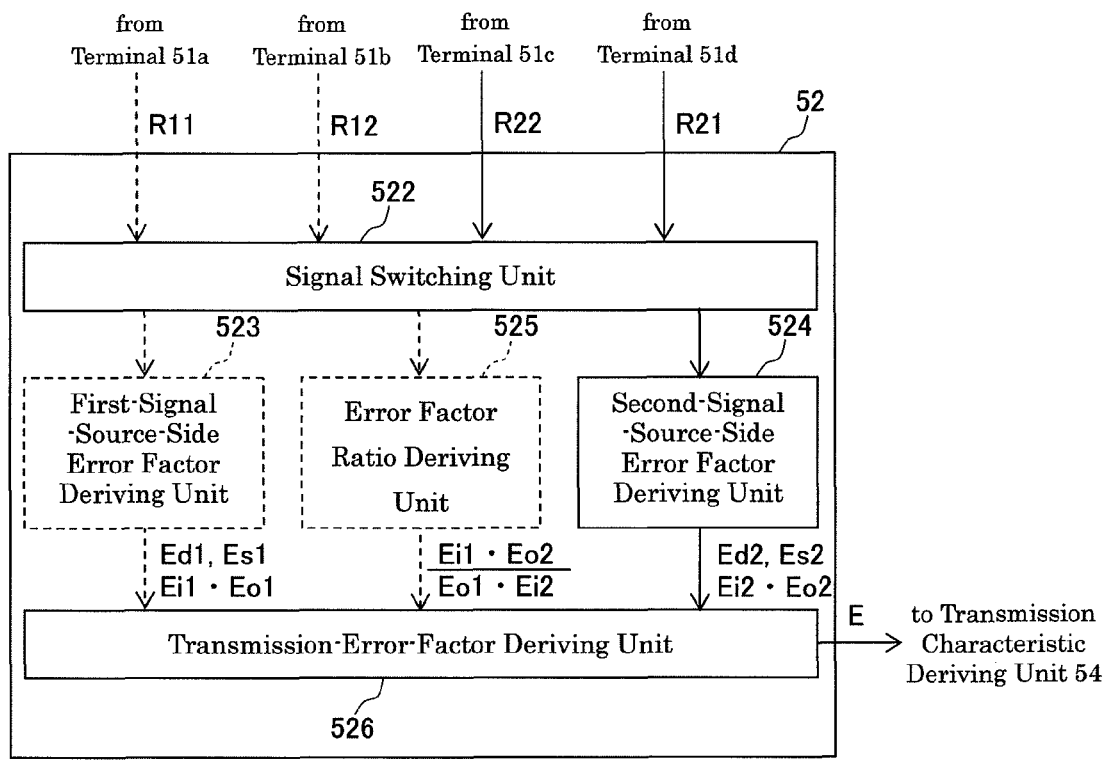
FIG. 13 shows an operation of the error factor deriving unit 52 in the state in which the reflection element 42P, 42S, or 42L is connected to the second signal source 20.

FIG. 13 shows an operation of the error factor deriving unit 52 in the state in which the reflection element 42P, 42S, or 42L is connected to the second signal source 20. In FIG. 13, components which are inactive are represented by dotted lines.

The signal switching unit 522 receives R22 and R21 respectively from the terminals 51c and 51d. It should be noted that the signal switching unit 522 does not receive signals from the terminals 51a and 51b. The signal switching unit 522 feeds R22 and R21 to the second-signal-source-side error factor deriving unit 524. The signal switching unit 522 feeds signals to neither the first-signal-source-side error factor deriving unit 523 nor the error factor ratio deriving unit 525. It should be noted that R22 and R21 can be considered as results of a measurement of the signal in the state in which the reflection element 42P, 42S or 42L is connected to the second signal source 20.

The second-signal-source-side error factor deriving unit 524 derives Ed2, Es2, and Ei2·Eo2 by assigning R21 (the result of the measurement of the signal before the signal is reflected by the reflection element 42P, 42S, or 42L), R22 (the result of the measurement of the signal reflected by the reflection element 42P, 42S, or 42L), and X (the load coefficient of the reflection element 42P (open), the load coefficient of the reflection element 42S (short), or the load coefficient of the reflection element 42L (load)) to the equation (2).

Ed2, Es2, and Ei2·Eo2 derived by the second-signal-source-side error factor deriving unit 524 are fed to the transmission-error-factor deriving unit 526.

The error factor ratio deriving unit 525 derives an error factor ratio which is a ratio between a first transmission error factor and a second transmission error factor based on measurement result of the signals in states in which the first signal source 10 and the second signal source 20 are connected with each other via the transmission element 44 (refer to FIGS. 14 and 15). It should be noted that the first transmission error factor is an error factor (Ei1·Eo2) when the signal is transmitted from the first signal source 10 to the second signal source 20. The second transmission error factor is an error factor (Ei2·Eo1) when the signal is transmitted from the second signal source 20 to the first signal source 10. The state in which the first signal source 10 and the second signal source 20 are connected with each other via the transmission element 44 implies a state in which the first terminal 44a is connected to the first signal source 10 via the switch 31, and the second terminal 44b is connected to the second signal source 20 via the switch 32.

FIG. 14 shows the state in which the signal is transmitted from the first signal source 10 to the second signal source 20 when the first signal source 10 and the second signal source 20 are connected with each other via the transmission element 44.

The signal generated by the signal generation unit 12 is fed to the bridge 14a via the switch 13. The mixer 16a receives one of the outputs of the bridge 14a, and multiplies it by the local signal with the predetermined local frequency. The output R11 of the mixer 16a can be considered as a result of the measurement of the signal before the signal is transmitted by the transmission element 44. R11 is fed to the terminal 51a.

The bridge 14b receives and directly outputs the other one of the outputs of the bridge 14a. The output is fed from the output terminal 19 to the transmission element 44, and a part of the output is reflected by the transmission element 44. The reflected signal is fed to the bridge 14b via the output terminal 19. The bridge 14b feeds the signal fed via the output terminal 19 to the mixer 16b. The mixer 16b multiplies the signal fed via the output terminal 19 and the local signal by each other. The output R12 of the mixer 16b can be considered as a result of the measurement of the signal before the signal is transmitted by the transmission element 44. R12 is fed to the terminal 51b.

The signal output from the output terminal 19 is fed to the output terminal 29 via the switch 31, the transmission element 44, and the switch 32.

The signal fed to the output terminal 29 is fed to the bridge 24b. The bridge 24b feeds the signal fed via the output terminal 29 to the mixer 26b. The mixer 26b multiplies the signal fed via the output terminal 29 and the local signal by each other. The output R22 of the mixer 26b can be considered as a result of the measurement of the signal transmitted by the transmission element 44. R22 is fed to the terminal 51c.

It should be noted that the output of the bridge 24a is fed to the mixer 26a. The mixer 26a multiplies the output of the bridge 24a and the local signal by each other. The output R21 of the mixer 26a is fed to the terminal 51d.

Moreover, since the switch 23 is connected to the terminating resistor, the signal is not fed from the signal generation unit 22 to the bridge 24a.

FIG. 15 shows the state in which the signal is transmitted from the second signal source 20 to the first signal source 10 when the first signal source 10 and the second signal source 20 are connected with each other via the transmission element 44.

The signal generated by the signal generation unit 22 is fed to the bridge 24a via the switch 23. The mixer 26a receives one of the outputs of the bridge 24a, and multiplies it by the local signal with the predetermined local frequency. The output R21 of the mixer 26a can be considered as a result of the measurement of the signal before the signal is transmitted by the transmission element 44. R21 is fed to the terminal 51d.

The bridge 24b receives and directly outputs the other one of the outputs of the bridge 24a. The output is fed from the output terminal 29 to the transmission element 44, and a part of the output is reflected by the transmission element 44. The reflected signal is fed to the bridge 24b via the output terminal 29. The bridge 24b feeds the signal fed via the output terminal 29 to the mixer 26b. The mixer 26b multiplies the signal fed via the output terminal 29 and the local signal by each other. The output R22 of the mixer 26b can be considered as a result of the measurement of the signal before the signal is transmitted by the transmission element 44. R22 is fed to the terminal 51c.

The signal output from the output terminal 29 is fed to the output terminal 19 via the switch 32, the transmission element 44, and the switch 31.

The signal fed to the output terminal 19 is fed to the bridge 14b. The bridge 14b feeds the signal fed via the output terminal 19 to the mixer 16b. The mixer 16b multiplies the signal fed via the output terminal 19 and the local signal by each other. The output R12 of the mixer 16b can be considered as a result of the measurement of the signal transmitted by the transmission element 44. R12 is fed to the terminal 51b.

It should be noted that the output of the bridge 14a is fed to the mixer 16a. The mixer 16a multiplies the output of the bridge 14a and the local signal by each other. The output R11 of the mixer 16a is fed to the terminal 51a.

Moreover, since the switch 13 is connected to the terminating resistor, the signal is not fed from the signal generation unit 12 to the bridge 14a.

FIG. 16(a) is a signal flow graph representing the state in FIG. 14 (in which the signal is transmitted from the first signal source 10 to the second signal source 20), and FIG. 16(b) is a signal flow graph representing the state in FIG. 15 (in which the signal is transmitted from the second signal source 20 to the first signal source 10). It should be noted that S11, S12, S21, and S22 are transmission characteristics of the transmission element 44. The other reference numerals are the same as those in FIG. 2.

As described before, the transmission element 44 satisfies the relationship S21=S12. Therefore, referring to FIGS. 14 and 15, (Ei1·Eo2)/(Ei2·Eo1) can be obtained based on S11$m$, S21$m$, S12$m$, S22$m$, R21$m$, and R12$m$.

For example, for the sake of understanding, if Ed1=Es1=Ed2=Es2=S11=S22=0 holds, relationships Ei1·Eo2·S21=S21$m$ (refer to FIG. 16(a)), and Ei2·Eo1·S12=S12$m$ (refer to FIG. 16(b)) hold. As a result, S21$m$/S12$m$=(Ei1·Eo2·S21)/(Ei2·Eo1·S12) is obtained. On this occasion, since S21=S12 holds, S21$m$/S12$m$=(Ei1·Eo2·S21)/(Ei2·Eo1·S12)=(Ei1·Eo2)/(Ei2·Eo1).

Even if Ed1=Es1=Ed2=Es2=S11=S22=0 does not hold, (Ei1·Eo2)/(Ei2·Eo1) can be represented as the following equation (3) according to FIGS. 16(a) and 16(b).

$$(Ei1 \cdot Eo2)/(Ei2 \cdot Eo1)=(S21m-S22mR21m)/(S12m-S11mR12m) \quad (3)$$

Figure 17:
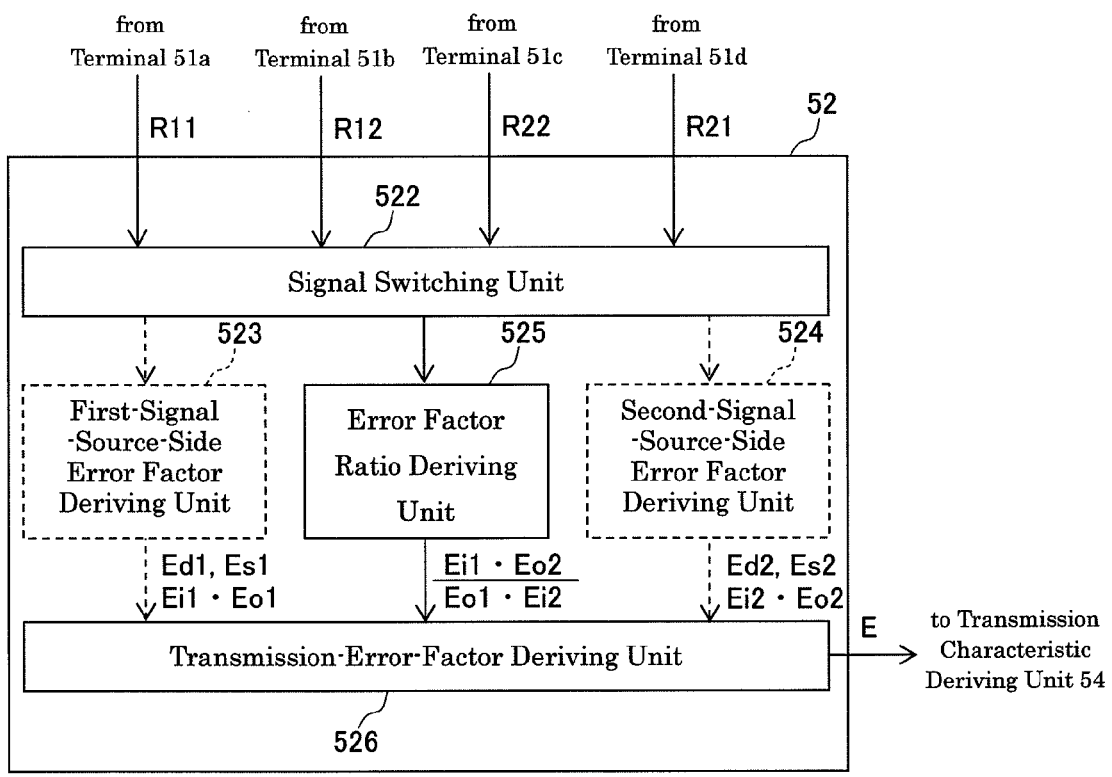
FIG. 17 shows an operation of the error factor deriving unit 52 in the state in which the first signal source 10 and the second signal source 20 are connected with each other via the transmission element 44.

FIG. 17 shows an operation of the error factor deriving unit 52 in the state in which the first signal source 10 and the second signal source 20 are connected with each other via the transmission element 44. In FIG. 17, components which are inactive are represented by dotted lines.

The signal switching unit 522 receives R11, R12, R22, and R21 respectively from the terminals 51a, 51b, 51c, and 51d. The signal switching unit 522 feeds R11, R12, R22, and R21 to the error factor ratio deriving unit 525. The signals are fed to neither the first-signal-source-side error factor deriving unit 523 nor the second-signal-source-side error factor deriving unit 524. It should be noted that R11, R12, R22, and R21 can be considered as a result of a measurement of the signal while the first signal source 10 and the second signal source 20 are connected with each other via the transmission element 44.

The error factor ratio deriving unit 525 derives (Ei1·Eo2)/(Ei2·Eo1) by assigning R11, R12, R22, and R21 to the equation (3). In the state shown in FIG. 14 (the signal is transmitted from the first signal source 10 to the second signal source 20), R11 and R12 can be considered as results of a measurement of the signal before the signal is transmitted by the transmission element 44, and R22 can be considered as a result of a measurement of the signal transmitted by the transmission element 44. Moreover, in the state shown in FIG. 15 (the signal is transmitted from the second signal source 20 to the first signal source 10), R21 and R22 can be considered as results of a measurement of the signal before the signal is transmitted by the transmission element 44, and R12 can be considered as a result of a measurement of the signal transmitted by the transmission element 44.

The error factor ratio (Ei1·Eo2)/(Ei2·Eo1) derived by the error factor ratio deriving unit 525 is fed to the transmission error factor deriving unit 526.

The transmission error factor deriving unit 526 derives the first transmission error factor (Ei1·Eo2) and the second transmission error factor (Ei2·Eo1) based on the error factor Ei1·Eo1 in the first signal source 10, the error factor Ei2·Eo2 in the second signal source 20, and the error factor ratio (Ei1·Eo2)/(Ei2·Eo1).

When the first transmission error factor is denoted by P, and the second transmission error factor is denoted by Q, it is possible to acquire P·Q from Ei1·Eo1 and Ei2·Eo2. This is because P·Q=(Ei1·Eo2)·(Ei2·Eo1)=(Ei1·Eo1)·(Ei2·Eo2). Moreover, P/Q has been derived as the error factor ratio (Ei1·Eo2)/(Ei2·Eo1). It is thus possible to derive P and Q when P·Q and P/Q are known. If P·Q is represented as A, and P/Q is represented as B, P=±B (A/B)$^{1/2}$, Q=±(A/B)$^{1/2}$ (double signs in the same order).

It should be noted that the sign of P is set so that arg(P) and arg(S21$m$/S21) are approximately equal. The sign of Q is set so that arg(Q) and arg(S12$m$/S12) are approximately equal. In this way, in order to determine the signs of P and Q, it is assumed that the phase of S21 is known to such a degree that the deviation is within 180 degrees. Moreover, arg(P) denotes the argument of P.

The transmission error factor deriving unit 526 feeds, in addition to the first transmission error factor (Ei1·Eo2) and the second transmission error factor (Ei2·Eo1), the error factors in the first signal source 10: Ed1, Es1, and Ei1·Eo1, and the error factors in the second signal source 20: Ed2, Es2, and Ei2·Eo2 to the transmission characteristic deriving unit 54. It should be noted that the first transmission error factor (Ei1·Eo2), the second transmission error factor (Ei2·Eo1), the error factors in the first signal source 10: Ed1, Es1, and Ei1·Eo1, and the error factors in the second signal source 20: Ed2, Es2, and Ei2·Eo2 may be denoted by E. It should be noted that the first transmission error factor (Ei1·Eo2) and the second transmission error factor (Ei2·Eo1) can also be considered as error factors respectively in the first signal source 10 and the second signal source 20.

In this way, the error factor deriving unit 52 derives the error factors E in the first signal source 10 and the second signal source 20 based on the measurement results R11 and R12 of the signal in the state in which the reflection elements 41P, 41S, and 41L are respectively connected to the first signal source 10 (refer to FIG. 9), the measurement results R21 and R22 of the signal in the state in which the reflection elements 42P, 42S, and 42L are respectively connected to the second signal source 20 (refer to FIG. 13), and the measurement results R11, R12, R21, and R22 of the signals in the state in which the first signal source 10 and the second signal source 20 are connected with each other via the transmission element 44 (refer to FIG. 17).

The transmission characteristics of the transmission element 44 are not used for the derivation of the error factors E carried out by the error factor deriving unit 52. However, the relationship: S21=S12 is used for the derivation of the error factors E carried out by the error factor deriving unit 52. The method for deriving error factors E without using the transmission characteristics of the transmission element 44 but with using the relationship: S21=S12 in this way is referred to as SOLR calibration.

Referring again to FIG. 4, the signal measurement unit 53 receives the measurement results R11, R12, R21, and R22 of the signal in the state in which the first signal source 10 and second signal source 20 are connected with each other via the transmission element 44 (refer to FIGS. 14 and 15). It should be noted that R11, R12, R21, and R22 may be denoted by Rij (i=1, 2, and j=1, 2).

The transmission characteristic deriving unit 54 receives the measurement results Rij of the signal from the signal measurement unit 53, and further receives the error factors E derived by the error factor deriving unit 52. The transmission characteristic deriving unit 54 derives the transmission characteristics S11, S12, S21, and S22 of the transmission element 44 based on the measurement results Rij of the signal and the derived error factors E. The derived transmission characteristics of the transmission element 44 are denoted by Sija (i=1, 2, and j=1, 2). It is appreciated that, with reference to FIG. 16, the transmission characteristics S11, S12, S21, and S22 of the transmission element 44 can be represented by the measurement results Rij of the signal and the derived error factors E.

The transmission characteristic recording unit 56 records known transmission characteristics S11, S12, S21, and S22 of the transmission element 44. The known transmission characteristics of the transmission element 44 are denoted by Sijt (i=1, 2, and j=1, 2). It should be noted that "known" implies "known before the derivation carried out by the transmission characteristic deriving unit 54". Moreover, the known transmission characteristics Sijt of the transmission element 44 are true values of the transmission characteristics of the transmission element 44.

The reflection element state determination unit 58 determines whether the reflection elements 41P, 41S, 41L, 42P, 42S, and 42L are realizing the predetermined reflection states based on the transmission characteristics Sija of the transmission element 44 derived by the transmission characteristic deriving unit 54 and the transmission characteristics Sijt of the transmission element 44 known before the derivation carried out by the transmission characteristic deriving unit 54.

That the reflection elements 41P, 41S, 41L, 42P, 42S, and 42L are realizing the predetermined reflection states means the reflection elements 41P and 42P are realizing the non-connection state (open), the reflection elements 41S and 42S are realizing the short-circuit state (short), and the reflection elements 41L and 42L are realizing the state with zero of the reflection coefficient.

The error factor deriving unit 52 assumes that the reflection elements 41P, 41S, 41L, 42P, 42S, and 42L are realizing the predetermined reflection states when it derives the error factors E of the first signal source 10 and the second signal source 20. Based on this assumption, the error factor deriving unit 52 derives Ed1, Es1, Ei1·Eo1, Ed2, Es2, and Ei2·Eo2 by assigning the load coefficient of the reflection elements 41P, 41S, 41L, 42P, 42S, and 42L to X in the equations (1) and (2).

Therefore, if this assumption is correct, the error factors E of the first signal source 10 and the second signal source 20 are correctly derived. Thus, the transmission characteristics Sija of the transmission element 44 derived by the transmission characteristic deriving unit 54 are to coincide with the known transmission characteristics Sijt (namely true values) of the transmission element 44 (or as close to them as seemingly coincident with them).

Moreover, if this assumption is not correct, the error factors E of the first signal source 10 and the second signal source 20 are not correctly derived. Thus, the transmission characteristics Sija of the transmission element 44 derived by the transmission characteristic deriving unit 54 are not to coincide with the known transmission characteristics Sijt (namely true values) of the transmission element 44.

Thus, the reflection element state determination unit 58 determines that the reflection elements 41P, 41S, 41L, 42P, 42S, and 42L are realizing the predetermined reflection states if the transmission characteristics Sija of the transmission element 44 derived by the transmission characteristic deriving unit 54 coincide with the known transmission characteristics Sijt of the transmission element 44 (or as close to them as seemingly coincident with them).

On the other hand, the reflection element state determination unit 58 determines that the reflection elements 41P, 41S, 41L, 42P, 42S, and 42L are not realizing the predetermined reflection states if the transmission characteristics Sija of the transmission element 44 derived by the transmission characteristic deriving unit 54 do not coincide with the known transmission characteristics Sijt of the transmission element 44.

If the reflection elements 41P, 41S, 41L, 42P, 42S, and 42L are realizing the predetermined reflection states, the error factors E in the first signal source 10 and the second signal source 20 are correctly derived. Therefore, the error factors E can be used for calibration for the measurement system shown in FIG. 1.

A description will now be given of an operation of the first embodiment of the present invention.

Figure 18:
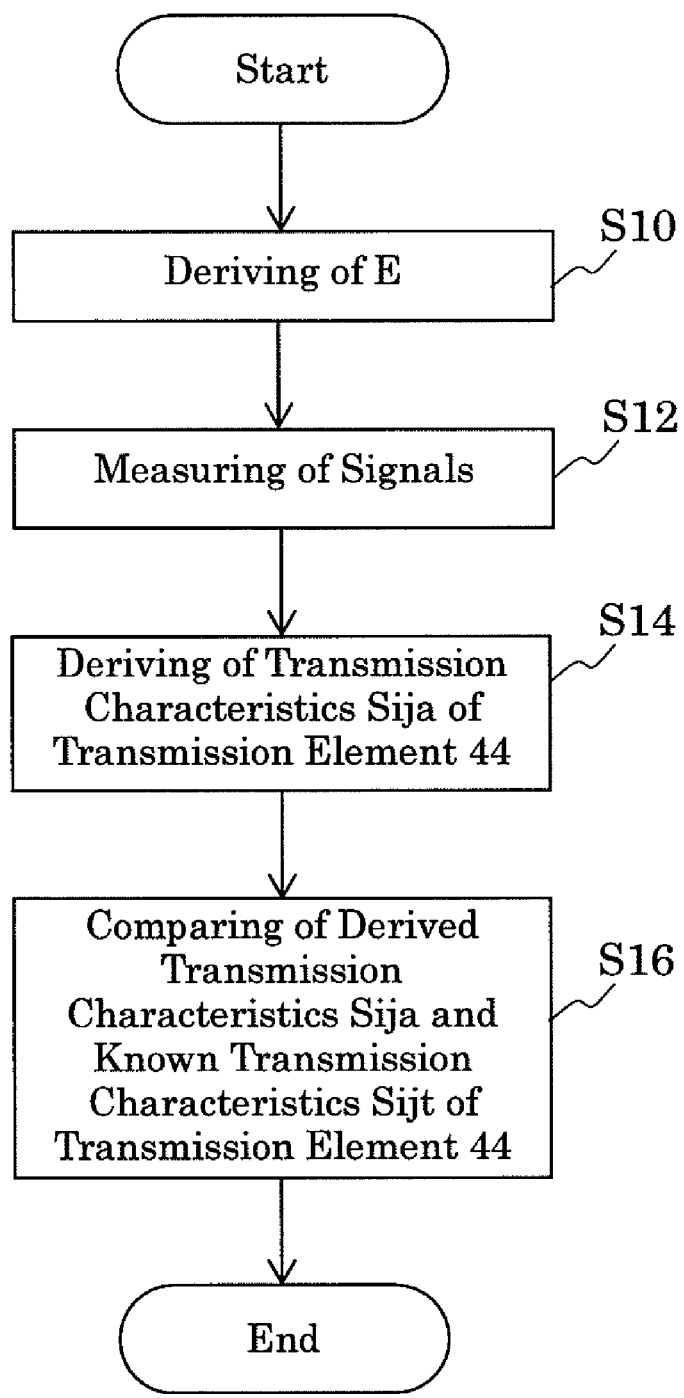
FIG. 18 is a flowchart showing the operation of the first embodiment of the present invention.

FIG. 18 is a flowchart showing the operation of the first embodiment of the present invention. First, the error factor deriving unit 52 derives the error factors E in the first signal source 10 and the second signal source 20 (S10).

Figure 19:
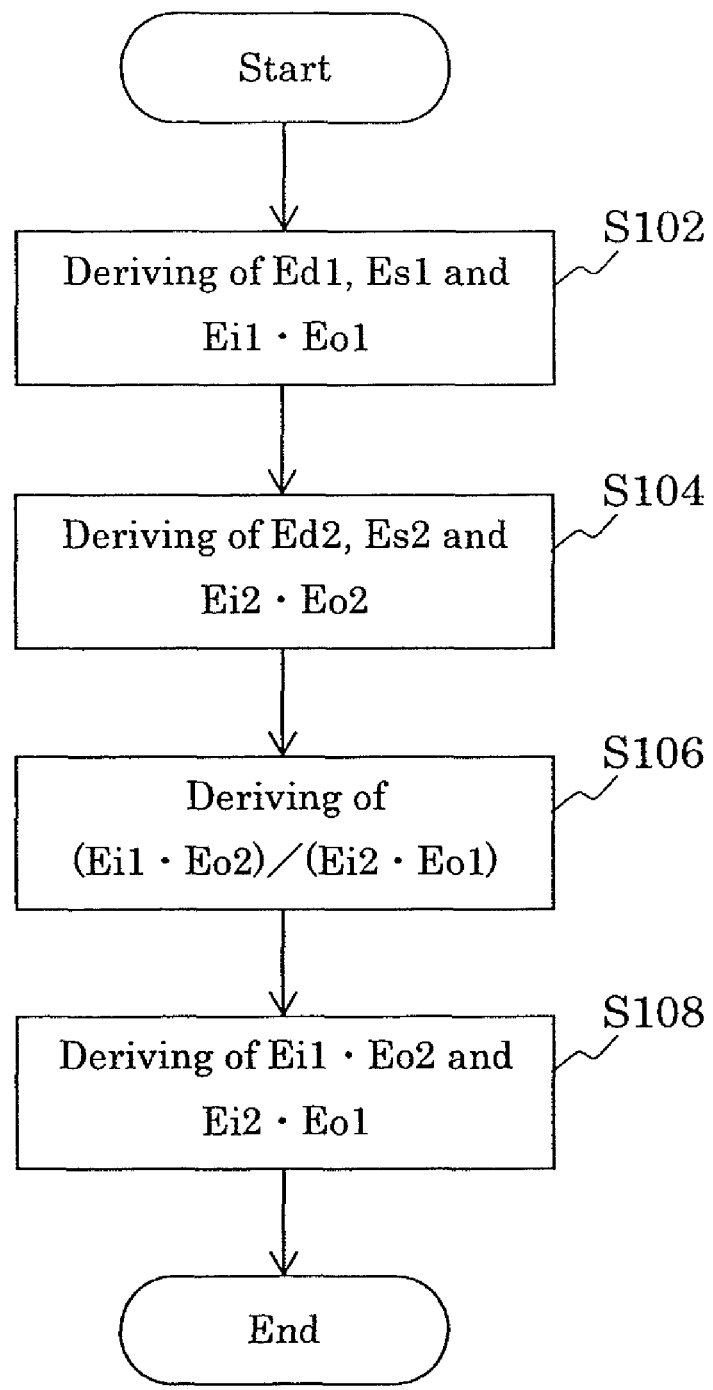
FIG. 19 is a flowchart showing an operation when the error factor deriving unit 52 derives the error factors E.

FIG. 19 is a flowchart showing an operation when the error factor deriving unit 52 derives the error factors E.

First, as shown in FIG. 8, the terminals 51a and 51b are respectively connected to the mixers 16a and 16b. Moreover, as shown in FIGS. 6(a) to 6(c), the reflection elements 41P, 41S, and 41L are respectively connected to the first signal source 10. On this occasion, as shown in FIG. 9, the signal switching unit 522 receives R11 and R12 from the terminals 51a and 51b, and feeds them to the first-signal-source-side error factor deriving unit 523. The first-signal-source-side error factor deriving unit 523 derives Ed1, Es1, and Ei1·Eo1 by assigning R11, R12, and X (load coefficient of the reflection element 41P (open), the load coefficient of the reflection element 41S (short-circuit), or the load coefficient of the reflection element 41L (load)) to the equation (1) (S102).

Ed1, Es1, and Ei1·Eo1 derived by the first-signal-source-side error factor deriving unit 523 are fed to the transmission error factor deriving unit 526.

Then, as shown in FIG. 12, the terminals 51c and 51d are respectively connected to the mixers 26b and 26a. Moreover, as shown in FIGS. 10(a), 10(b), and 10(c), the reflection elements 42P, 42S, and 42L are respectively connected to the second signal source 20. On this occasion, as shown in FIG. 13, the signal switching unit 522 receives R22 and R21 from the terminals 51c and 51d, and feeds them to the second-signal-source-side error factor deriving unit 524. The second-signal-source-side error factor deriving unit 524 derives Ed2, Es2, and Ei2·Eo2 by assigning R22, R21, and X (load coefficient of the reflection element 42P (open), the load coefficient of the reflection element 42S (short-circuit), or the load coefficient of the reflection element 42L (load)) to the equation (2) (S104).

Ed2, Es2, and Ei2·Eo2 derived by the second-signal-source-side error factor deriving unit 524 are fed to the transmission error factor deriving unit 526.

Moreover, as shown in FIG. 14, the terminals 51a, 51b, 51c, and 51d are respectively connected to the mixers 16a, 16b, 26b, and 26a. Further, the first signal source 10 and the second signal source 20 are connected with each other via the transmission element 44. On this occasion, the switch 13 connects the signal generation unit 12 and the bridge 14a with each other. On the other hand, the switch 23 connects the signal generation unit 22 and the terminating resistor with each other.

In this state, as shown in FIG. 17, the signal switching unit 522 receives the R11, R12, R22, and R21 respectively from the terminals 51a, 51b, 51c, and 51d, and feeds them to the error factor ratio deriving unit 525. Referring to FIG. 16(a), it is appreciated that S21m, S11m, and R21m are respectively R22/R11, R12/R11, and R21/R11. The error factor ratio deriving unit 525 acquires S21m, S11m, and R21m.

Moreover, as shown in FIG. 15, the terminals 51a, 51b, 51c, and 51d are respectively connected to the mixers 16a, 16b, 26b, and 26a. Further, the first signal source 10 and the second signal source 20 are connected with each other via the transmission element 44. On this occasion, the switch 13 connects the signal generation unit 12 and the terminating resistor with each other. On the other hand, the switch 23 connects the signal generation unit 22 and the bridge 24a with each other.

In this state, as shown in FIG. 17, the signal switching unit 522 receives the R11, R12, R22, and R21 respectively from the terminals 51a, 51b, 51c, and 51d, and feeds them to the error factor ratio deriving unit 525. Referring to FIG. 16(b), it is appreciated that S22m, S12m, and R12m are respectively R22/R21, R12/R21, and R11/R21. The error factor ratio deriving unit 525 acquires S22m, S12m, and R12m.

By assigning S21m, S11m, R21m, S22m, S12m, and R12m acquired in this way to the equation (3), the error factor ratio deriving unit 525 derives the error factor ratio (Ei1·Eo2)/(Ei2·Eo1) (S106).

The error factor ratio (Ei1·Eo2)/(Ei2·Eo1) derived by the error factor ratio deriving unit 525 is fed to the transmission error factor deriving unit 526.

The transmission error factor deriving unit 526 derives the first transmission error factor (Ei1·Eo2) and the second transmission error factor (Ei2·Eo1) based on the error factor Ei1·Eo1 in the first signal source 10, the error factor Ei2·Eo2 in the second signal source 20, and the error factor ratio (Ei1·Eo2)/(Ei2·Eo1) (S108). When the first transmission error factor is denoted by P, and the second transmission error factor is denoted by Q, P·Q=(Ei1·Eo2)·(Ei2·Eo1)=(Ei1·Eo1)·(Ei2·Eo2), the error factor ratio is represented by P/Q, and, thus, P and Q can be derived since P·Q and P/Q are known.

The transmission error factor deriving unit 526 feeds the error factors E to the transmission characteristic deriving unit 54.

Then, referring again to FIG. 18, the signals are measured in the states (refer to FIGS. 14 and 15) in which the first signal source 10 and the second signal source 20 are connected with each other via the transmission element 44 (S12). The measurement results of the signals R11, R12, R21 and R22 are fed to the signal measurement unit 53.

The transmission characteristic deriving unit 54 receives the measurement results Rij of the signal from the signal measurement unit 53, and further receives the error factors E derived by the error factor deriving unit 52. The transmission characteristic deriving unit 54 derives the transmission characteristics Sija of the transmission element 44 based on the measurement results Rij of the signal and the derived error factors E (S14).

The reflection element state determination unit 58 receives the transmission characteristics Sija of the transmission element 44 derived by the transmission characteristic deriving unit 54. Moreover, the reflection element state determination unit 58 reads the transmission characteristics Sijt (namely true values) of the transmission element 44 known before the derivation carried out by the transmission characteristic deriving unit 54 from the transmission characteristic recording unit 56. Moreover, the reflection element state determination unit 58 compares the transmission characteristics Sija and the transmission characteristics Sijt (true values) with each other, thereby determining whether the reflection elements 41P, 41S, 41L, 42P, 42S, and 42L are realizing the predetermined reflection states (S16).

If the transmission characteristics Sija and the transmission characteristics Sijt coincide with each other (or are as close to each other as seemingly coincident with each other), the reflection element state determination unit 58 determines that the reflection elements 41P, 41S, 41L, 42P, 42S, and 42L are realizing the predetermined reflection states.

If the transmission characteristics Sija and the transmission characteristics Sijt do not coincide with each other, the reflection element state determination unit 58 determines that the reflection elements 41P, 41S, 41L, 42P, 42S, and 42L are not realizing the predetermined reflection states.

Figure 20:
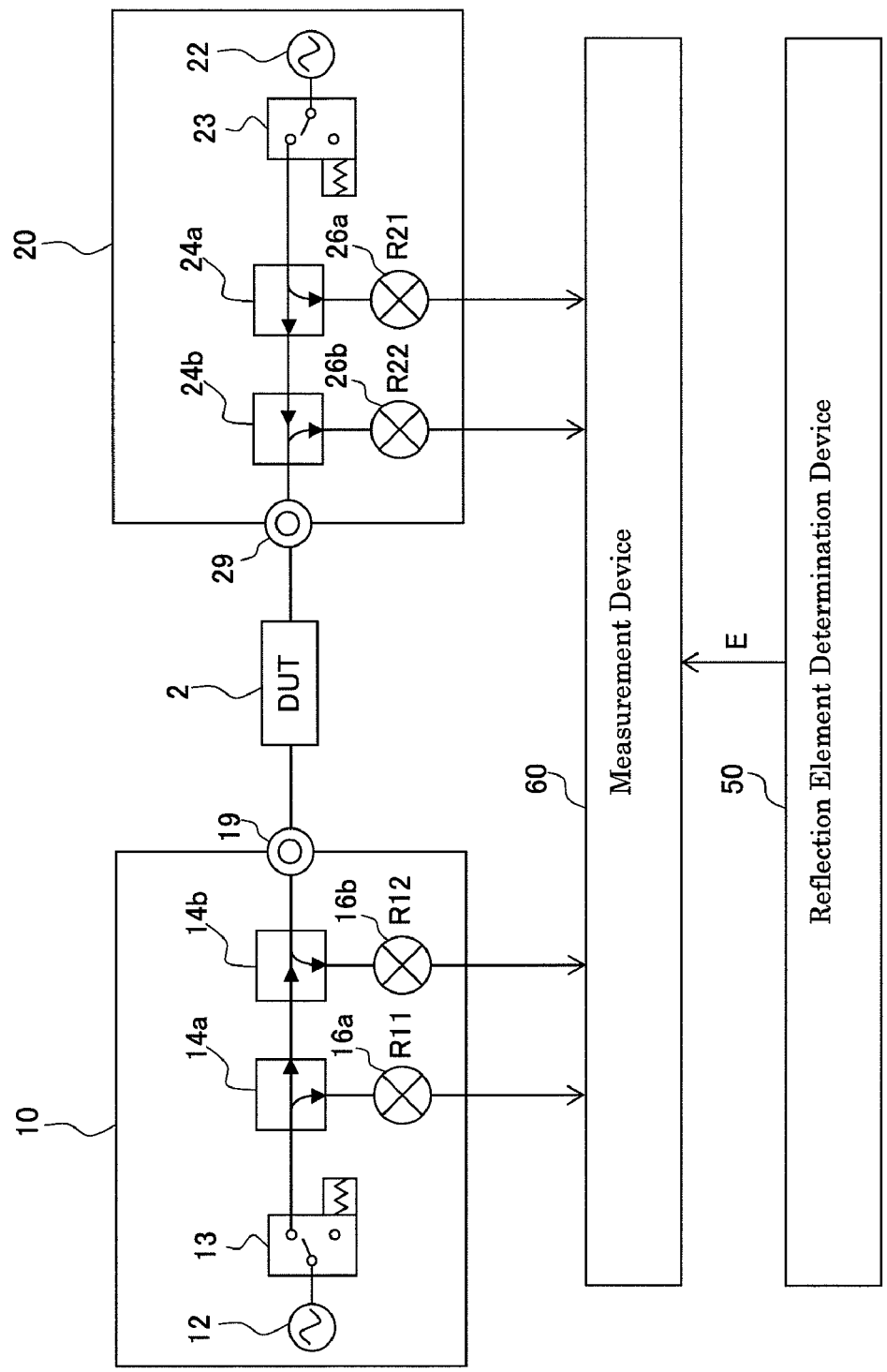
FIG. 20 shows a system configuration when the reflection element determination device 50 is used for a calibration of a measurement system.

FIG. 20 shows a system configuration when the reflection element determination device 50 is used for a calibration of a measurement system.

First, while the system configuration shown in FIG. 3 is provided, the reflection element determination device 50 determines that the reflection elements 41P, 41S, 41L, 42P, 42S, and 42L are realizing the predetermined reflection states. Then, the reflection element determination device 50 and the device for calibration 4 are detached from the first signal source 10 and the second signal source 20.

Then, with reference to FIG. 20, as shown in FIG. 1, the first signal source 10 and the second signal source 20 are connected with each other via the device under test 2. Moreover, the mixers 16a and 16b of the first signal source 10 and the mixers 26a and 26b of the second signal source 20 are attached to a measurement device 60. Moreover, the reflection element determination device 50 is attached to the measurement device 60, and the error factors E are fed from the error factor deriving unit 52 of the reflection element determination device 50 to the measurement device 60.

It should be noted that the error factors E are derived, as described above, by the error factor deriving unit 52 based on the measurement results R11 and R12 of the signals in the states in which the reflection elements 41P, 41S, and 41L are respectively connected to the first signal source 10 (refer to FIG. 9), the measurement results R21 and R22 of the signals in the states in which the reflection elements 42P, 42S, and 42L are respectively connected to the second signal source 20 (refer to FIG. 13), and the measurement results R11, R12, R21, and R22 of the signals in the state in which the first signal source 10 and the second signal source 20 are connected with each other via the transmission element 44 (refer to FIG. 17).

First, in the state shown in FIG. 20, the switch 13 connects the signal generation unit 12 and the bridge 14a with each other, and the switch 23 connects the signal generation unit 22 and the terminating resistor with each other. As a result, the signal generated by the signal generation unit 12 is output from the output terminal 19, and the signal generated by the signal generation unit 12 is input to the second signal source 20 via the output terminal 29. Then, R11, R12, R21, and R22 (measurement results of the signal) are fed from the mixers 16a, 16b, 26a, and 26b to the measurement device 60. This state is represented by the signal flow graph shown in FIG. 2(a).

Moreover, in the state shown in FIG. 20, the switch 13 connects the signal generation unit 12 and the terminating resistor with each other, and the switch 23 connects the signal generation unit 22 and the bridge 24a with each other. As a result, the signal generated by the signal generation unit 22 is output from the output terminal 29, and the signal generated by the signal generation unit 22 is input to the first signal source 10 via the output terminal 19. Then, R11, R12, R21, and R22 (measurement results of the signal) are fed from the mixers 16a, 16b, 26a, and 26b to the measurement device 60. This state is represented by the signal flow graph shown in FIG. 2(b).

The measurement device 60 measures the S parameters S11d, S12d, S21d, and S22d of the device under test 2 based on the measurement results R11, R12, R21, and R22 of the signals while the first signal source 10 and the second signal source 20 are connected with each other via the device under test 2, and the error factors E. According to the signal flow graphs shown in FIGS. 2(a) and 2(b), the S parameters S11d, S12d, S21d, and S22d of the device under test 2 can be represented by the measurement results R11, R12, R21, and R22 of the signals and the error factors E.

According to the first embodiment of the present invention, the reflection element determination device 50 can determine whether the reflection elements 41P, 41S, 41L, 42P, 42S, and 42L are realizing predetermined reflection states. If the reflection elements 41P, 41S, 41L, 42P, 42S, and 42L are realizing the predetermined reflection states, the error factors E derived by the error factor deriving unit 52 are correct. Thus, by acquiring the S parameters S11d, S12d, S21d, and S22d of the device under test 2 using these error factors E (refer to FIG. 20), it is possible to precisely acquire the S parameters of the device under test 2.

On this occasion, it should be noted that, in order to determine whether the reflection elements 41P, 41S, 41L, 42P, 42S, and 42L are realizing the predetermined reflection states, a check path the S parameters of which are known is not necessary in addition to the device for calibration 4. Since the transmission element 44 is also used as a check path, it is possible to eliminate a check path, thereby easily checking the reflection elements 41P, 41S, 41L, 42P, 42S, and 42L of the measurement system.

Second Embodiment

An element determination device 510 (refer to FIG. 21) according to a second embodiment determines, in the reflection element determination device 50 according to the first embodiment, when the known transmission characteristics of the transmission element 44 may not be the true values (for example, the transmission element 44 has undergone a secular change, or has failed), whether the reflection elements 41P, 41S, 41L, 42P, 42S, and 42L are realizing the predetermined reflection states, and the transmission element 44 is realizing a predetermined transmission state (known transmission characteristic).

Figure 21:
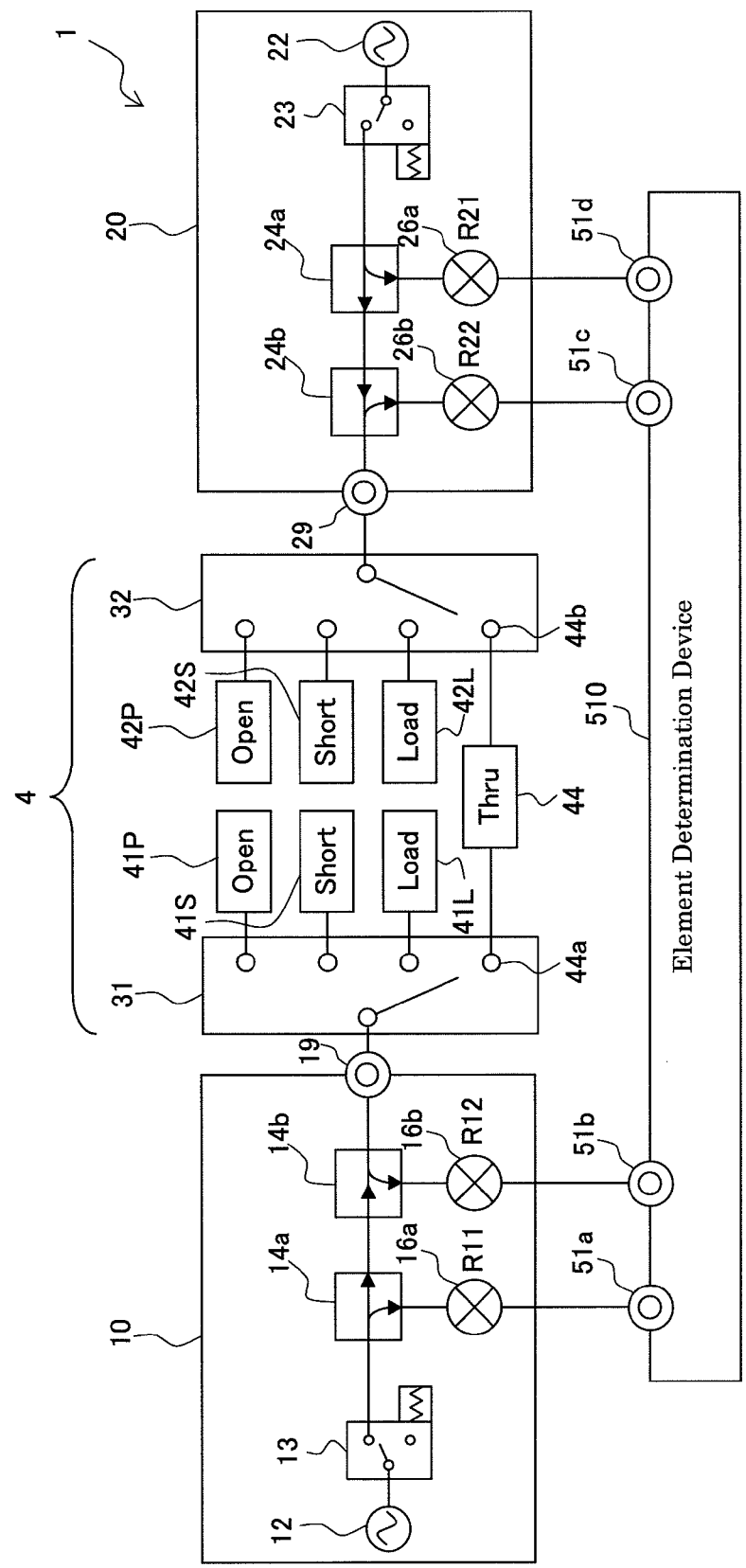
FIG. 21 shows the signal generation system 1 and the element determination device 510 according to the second embodiment of the present invention.

FIG. 21 shows the signal generation system 1 and the element determination device 510 according to the second embodiment of the present invention. It should be noted that the signal generation system 1 and the element determination device 510 constitute a calibration device.

The signal generation system 1 is the same as that of the first embodiment, and hence a description thereof is omitted.

Figure 22:
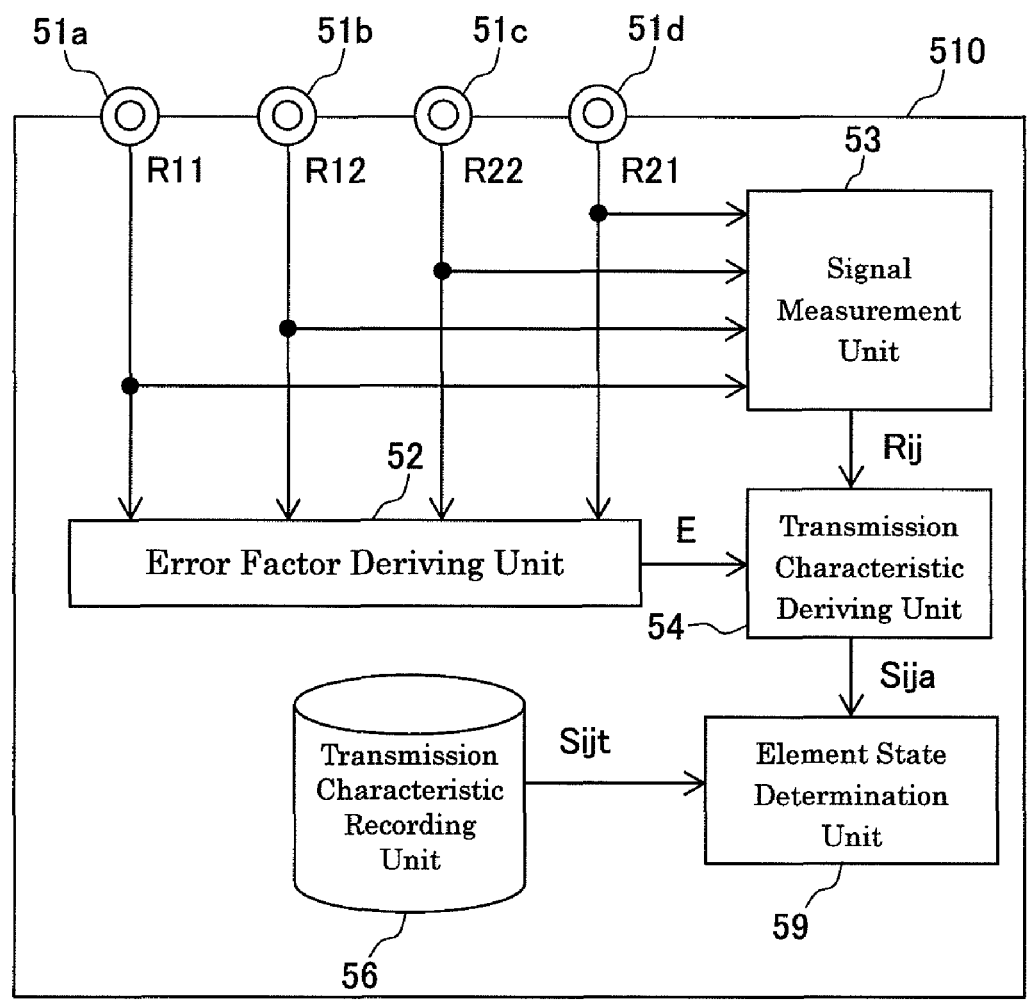
FIG. 22 is a functional block diagram showing a configuration of the element determination device 510 according to the second embodiment.

FIG. 22 is a functional block diagram showing a configuration of the element determination device 510 according to the second embodiment. The element determination device 510 includes the terminals 51a, 51b, 51c, and 51d, the error factor deriving unit 52, the signal measurement unit 53, the transmission characteristic deriving unit 54, the transmission characteristic recording unit 56, and an element state determination unit 59.

The terminals 51a, 51b, 51c, and 51d, the error factor deriving unit 52, the signal measurement unit 53, and the transmission characteristic deriving unit 54 are similar to those of the first embodiment, and hence a description thereof is omitted.

The transmission characteristic recording unit 56 records known transmission characteristics S11, S12, S21, and S22 of the transmission element 44. The known transmission characteristics of the transmission element 44 are denoted by Sijt (i=1, 2, and j=1, 2). It should be noted that "known" implies "known before the derivation carried out by the transmission characteristic deriving unit 54" (for example, values determined by specifications of the transmission element 44). However, according to the second embodiment, the known transmission characteristics Sijt of the transmission element 44 may not be true values of the transmission characteristics of the transmission element 44, which is different from the first embodiment. This is because the transmission characteristics of the transmission element 44 may be different from the know transmission characteristics due to a secular change or a failure of the transmission element 44.

The element state determination unit 59 determines whether the reflection elements 41P, 41S, 41L, 42P, 42S, and 42L are realizing the predetermined reflection states based on the transmission characteristics Sija of the transmission element 44 derived by the transmission characteristic deriving unit 54 and the transmission characteristics Sijt of the transmission element 44 known before the derivation carried out by the transmission characteristic deriving unit 54, and whether the transmission element 44 is realizing the predetermined transmission state (known transmission characteristic).

The definition of the predetermined reflection states is the same as that of the first embodiment, and hence a description thereof is omitted. The predetermined transmission state is the state of the transmission element 44 recorded in the transmission characteristic recording unit 56.

The error factor deriving unit 52 assumes that the reflection elements 41P, 41S, 41L, 42P, 42S, and 42L are realizing the predetermined reflection states when it derives the error factors E of the first signal source 10 and the second signal source 20. Based on this assumption, the error factor deriving unit 52 derives Ed1, Es1, Ei1·Eo1, Ed2, Es2, and Ei2·Eo2 by assigning the load coefficients of the reflection elements 41P, 41S, 41L, 42P, 42S, and 42L to X in the equations (1) and (2).

Therefore, if this assumption is correct, the error factors E of the first signal source 10 and the second signal source 20 are correctly derived. Thus, the transmission characteristics Sija of the transmission element 44 derived by the transmission characteristic deriving unit 54 are to coincide with the transmission characteristics of the transmission element 44 (or as close to them as seemingly coincident with them, which holds hereinafter). On this occasion, if the transmission characteristics of the transmission element 44 coincide with those of the predetermined transmission state (known transmission characteristics), the transmission characteristics Sija of the transmission element 44 derived by the transmission characteristic deriving unit 54 coincide with the known transmission characteristics Sijt of the transmission element 44.

In other words, if the reflection elements 41P, 41S, 41L, 42P, 42S, and 42L are realizing the predetermined reflection states and the transmission element 44 is realizing the predetermined transmission state, the transmission characteristics Sija of the transmission element 44 derived by the transmission characteristic deriving unit 54 coincide with the known transmission characteristics Sijt of the transmission element 44.

Therefore, if the transmission characteristics Sija of the transmission element 44 derived by the transmission characteristic deriving unit 54 do not coincide with the known transmission characteristics Sijt of the transmission element 44, there is considered either one or both of a case in which (1) the reflection elements 41P, 41S, 41L, 42P, 42S, and 42L are not realizing the predetermined reflection states, and a case in which (2) the transmission element 44 is not realizing the predetermined transmission state.

Thus, the element state determination unit 59 determines that the reflection elements 41P, 41S, 41L, 42P, 42S, and 42L are realizing the predetermined reflection states and the transmission element 44 is realizing the predetermined transmission state (known transmission characteristic) if the transmission characteristics Sija of the transmission element 44 derived by the transmission characteristic deriving unit 54 coincide with the known transmission characteristics Sijt of the transmission element 44.

On the other hand, the element state determination unit 59 determines that there arises either one or both of the case in which (1) the reflection elements 41P, 41S, 41L, 42P, 42S, and 42L are not realizing the predetermined reflection states, and the case in which (2) the transmission element 44 is not realizing the predetermined transmission state if the transmission characteristics Sija of the transmission element 44 derived by the transmission characteristic deriving unit 54 do not coincide with the known transmission characteristics Sijt of the transmission element 44.

If the reflection elements 41P, 41S, 41L, 42P, 42S, and 42L are realizing the predetermined reflection states and the transmission element 44 is realizing the predetermined transmission state (known transmission characteristics), the error factors E in the first signal source 10 and the second signal source 20 are correctly derived. Therefore, the error factors E can be used for calibration for the measurement system shown in FIG. 1.

A description will now be given of an operation of the second embodiment.

An operation of the second embodiment is the same as that of the first embodiment (refer to FIGS. 18 and 19). However, the operation of the second embodiment is different from that of the first embodiment in the step S16 in FIG. 18 according to the first embodiment, which will be described.

The element state determination unit 59 receives the transmission characteristics Sija of the transmission element 44 derived by the transmission characteristic deriving unit 54. Moreover, the element state determination unit 59 reads the transmission characteristics Sijt (known transmission characteristics) of the transmission element 44 known before the derivation carried out by the transmission characteristic deriving unit 54 from the transmission characteristic recording unit 56. Moreover, the element state determination unit 59 compares the transmission characteristics Sija and the transmission characteristics Sijt (known transmission characteristics) with each other, thereby determining whether the reflection elements 41P, 41S, 41L, 42P, 42S, and 42L are realizing the predetermined reflection states, and the transmission element 44 is realizing the predetermined transmission state (known transmission characteristics) (S16).

If the transmission characteristics Sija and the transmission characteristics Sijt coincide with each other, the element state determination unit 59 determines whether the reflection elements 41P, 41S, 41L, 42P, 42S, and 42L are realizing the predetermined reflection states, and the transmission element 44 is realizing the predetermined transmission state (known transmission characteristics).

If the transmission characteristics Sija and the transmission characteristics Sijt do not coincide with each other, the element state determination unit 59 determines that there arises either one or both of the case in which (1) the reflection elements 41P, 41S, 41L, 42P, 42S, and 42L are not realizing the predetermined reflection states, and the case in which (2) the transmission element 44 is not realizing the predetermined transmission state.

Figure 23:
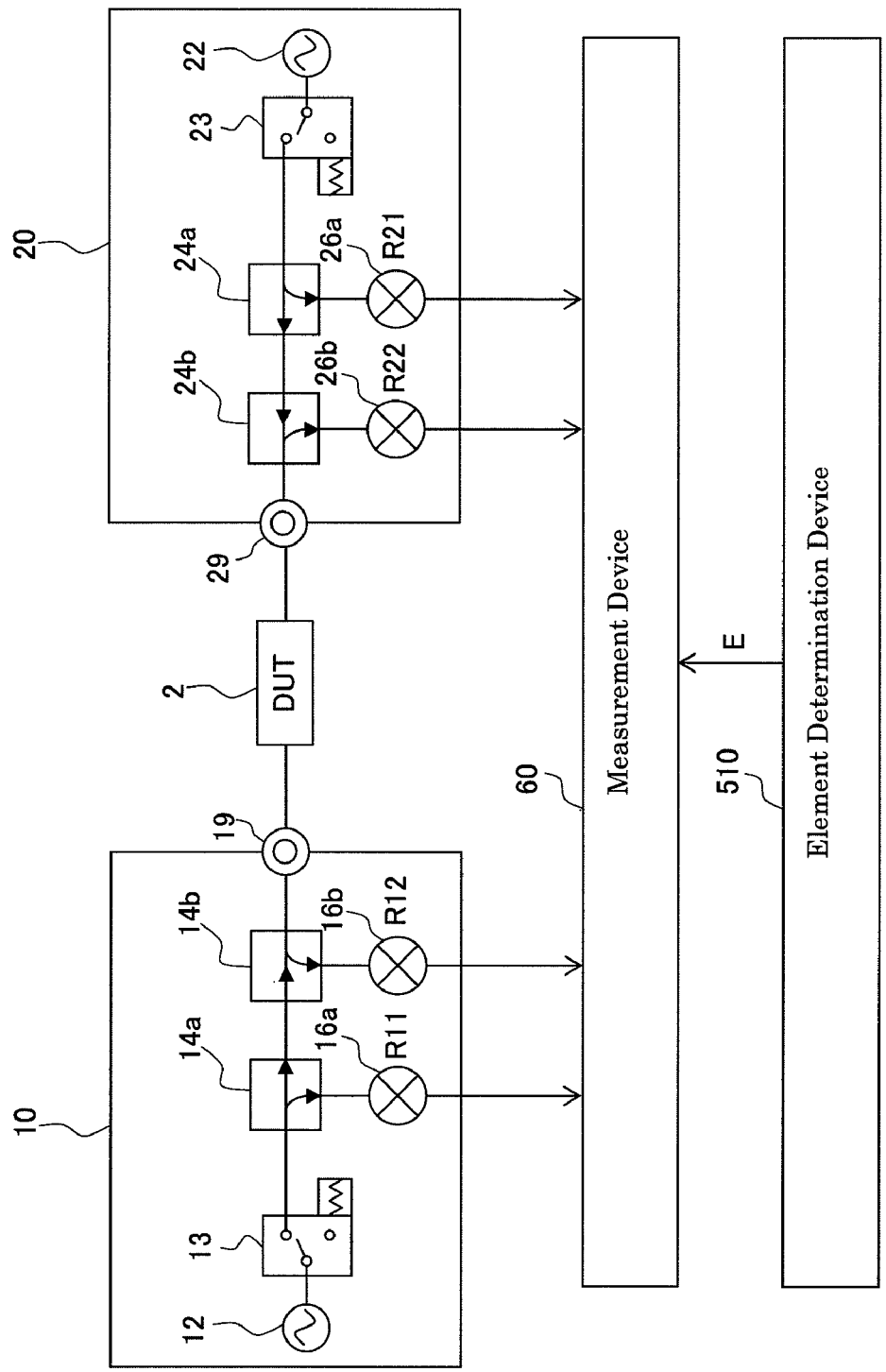
FIG. 23 shows a system configuration when the element determination device 510 is used for a calibration of a measurement system.

FIG. 23 shows a system configuration when the element determination device 510 is used for a calibration of a measurement system. The reflection element determination device 50 in the system configuration shown in FIG. 20 is simply replaced by the element determination device 510, and the same configuration as that described referring to FIG. 20 is provided.

According to the second embodiment of the present invention, the element determination unit 510 can determine whether the reflection elements 41P, 41S, 41L, 42P, 42S, and 42L are realizing the predetermined reflection states, and the transmission element 44 is realizing the predetermined transmission state (known transmission characteristics). If the reflection elements 41P, 41S, 41L, 42P, 42S, and 42L are realizing the predetermined reflection states and the transmission element 44 is realizing the predetermined transmission state (known transmission characteristics), it can be considered that the error factors E derived by the error factor deriving unit 52 are correct. Thus, by acquiring the S parameters S11d, S12d, S21d, and S22d of the device under test 2 using these error factors E (refer to FIG. 23), it is possible to precisely acquire the S parameters of the device under test 2.

On this occasion, it should be noted that, in order to determine whether the reflection elements 41P, 41S, 41L, 42P, 42S, and 42L are realizing the predetermined reflection states, and the transmission element 44 is realizing the predetermined transmission state (known transmission characteristic), a check path the S parameters of which are known is not necessary in addition to the device for calibration 4. Since the transmission element 44 is also used as a check path, it is possible to eliminate a check path, thereby easily checking the reflection elements 41P, 41S, 41L, 42P, 42S, and 42L and the transmission element 44 of the measurement system.

Moreover, the above-described embodiment may be realized in the following manner. A computer is provided with a CPU, a hard disk, and a media (such as a floppy disk (registered trade mark) and a CD-ROM) reader, and the media reader is caused to read a medium recording a program realizing the above-described respective components (such as the reflection element determination device 50 (except for the terminals 51a, 51b, 51c, and 51d) the measurement device 60, and the element determination device 510), thereby installing the program on the hard disk. This method may also realize the above-described functions.

The invention claimed is:

1. An element determination device for determining a state of a reflection element in a signal generation system which comprises a first signal source and a second signal source which can receive and transmit a signal, a reflection element which can be connected respectively to the first and second signal sources, and realizes a predetermined reflection state, and a transmission element which comprises a first terminal and a second terminal, and has a transmission characteristic for a direction from the first terminal to the second terminal and a transmission characteristic for a direction from the second terminal to the first terminal which are equal to each other, the element determination device comprising:

an error factor deriver that derives error factors in the first signal source and the second signal source based on a measurement result of a signal in respective states in which the reflection element is respectively connected to the first signal source and the second signal source, and a measurement result of a signal in a state in which the first terminal and the second terminal of the transmission element are respectively connected to the first signal source and the second signal source;

a transmission characteristic deriver that derives a transmission characteristic of the transmission element based on a measurement result of a signal in the state in which the first terminal and the second terminal of the transmission element are respectively connected to the first signal source and the second signal source and the derived error factors; and a reflection element state determiner that determines whether the reflection element realizes the predetermined reflection state by comparing the derived transmission characteristic of the transmission element with a transmission characteristic of the transmission element known before the derivation carried out by the transmission characteristic deriver.

2. The element determination device according to claim 1, wherein the measurement result of a signal in the respective states in which the reflection element is respectively connected to the first signal source and the second signal source comprises:

a result of a measurement of the signal before the signal is reflected by the reflection element, and a result of a measurement of the signal reflected by the reflection element.

3. The element determination device according to claim 1, wherein the reflection element realizes at least one of an open state, a short-circuit state, and a standard load state.

4. The element determination device according to claim 1, wherein the measurement result of a signal in the state in which the first terminal and the second terminal of the transmission element are respectively connected to the first signal source and the second signal source comprises:

a result of a measurement of the signal before the signal is transmitted by the transmission element, and a result a measurement of the signal transmitted by the transmission element.

5. The element determination device according to claim 1, wherein the error factor deriver comprises:

a first-signal-source-side error factor deriving unit that derives an error factor in the first signal source based on the measurement result of a signal in the state in which the reflection element is connected to the first signal source;

a second-signal-source-side error factor deriving unit that derives an error factor in the second signal source based on the measurement result of a signal in the state in which the reflection element is connected to the second signal source;

an error factor ratio deriving unit that derives an error factor ratio which is a ratio between a first transmission error factor upon transmission of a signal from the first signal source to the second signal source and a second transmission error factor upon transmission of a signal from the second signal source to the first signal source based on the measurement result of a signal in the state in which the first terminal and the second terminal of the transmission element are connected respectively to the first signal source and the second signal source; and a transmission error factor deriving unit that derives the first transmission error factor and the second transmission error factor based on the error factor in the first signal source, the error factor in the second signal source, and the error factor ratio.

6. An element determination device for determining a state of a reflection element and a transmission element in a signal generation system which comprises a first signal source and a second signal source which can receive and transmit a signal, a reflection element which can be connected respectively to the first and second signal sources, and realizes a predetermined reflection state, and a transmission element which realizes a predetermined transmission state, comprises a first terminal and a second terminal, and has a transmission characteristic for a direction from the first terminal to the second terminal and a transmission characteristic for a direction from the second terminal to the first terminal which are equal to each other, the element determination device comprising:

an error factor deriver that derives error factors in the first signal source and the second signal source based on a measurement result of a signal in respective states in which the reflection element is respectively connected to the first signal source and the second signal source, and a measurement result of a signal in a state in which the first terminal and the second terminal of the transmission element are respectively connected to the first signal source and the second signal source;

a transmission characteristic deriver that derives a transmission characteristic of the transmission element based on a measurement result of a signal in the state in which the first terminal and the second terminal of the transmission element are respectively connected to the first signal source and the second signal source and the derived error factors; and an element state determiner that determines whether the reflection element realizes the predetermined reflection state and whether the transmission element realizes the predetermined transmission state by comparing the derived transmission characteristic of the transmission element and with a transmission characteristic of the transmission element known before the derivation carried out by the transmission characteristic deriver.

7. A calibration device comprising:
the element determination device according to claim 1; and
the signal generation system.

8. A measurement system, comprising:
the element determination device of claim 1; and
a measurement device for measuring a device under test based on the derived error factors in the first signal source and the second signal source, and a measurement result of a signal in a state in which the first signal source and the second signal source are connected with each other via the device under test.

9. A measurement system, comprising:
the element determination device of claim 6; and
a measurement device for measuring a device under test based on the derived error factors in the first signal source and the second signal source, and a measurement result of a final in a state in which the first signal source and the second signal source are connected with each other via the device under test.

10. An element determination method for determining a state of a reflection element in a signal generation system which comprises a first signal source and a second signal source which can receive and transmit a signal, a reflection element which can be connected respectively to the first and second signal sources, and realizes a predetermined reflection state, and a transmission element which comprises a first terminal and a second terminal, and has a transmission characteristic for a direction from the first terminal to the second terminal and a transmission characteristic for a direction from the second terminal to the first terminal which are equal to each other, the element determination method comprising:

deriving error factors in the first signal source and the second signal source based on a measurement result of a signal in respective states in which the reflection element is respectively connected to the first signal source and the second signal source, and a measurement result of a signal in a state in which the first terminal and the second terminal of the transmission element are respectively connected to the first signal source and the second signal source;

deriving a transmission characteristic of the transmission element based on a measurement result of a signal in the state in which the first terminal and the second terminal of the transmission element are respectively connected to the first signal source and the second signal source and the derived error factors; and determining whether the reflection element realizes the predetermined reflection state by comparing the derived transmission characteristic of the transmission element with a transmission characteristic of the transmission element known before the transmission characteristic deriving derivation.

11. A non-transitory computer-readable medium having a program of instructions for execution by a computer to perform an element determination process for determining a state of a reflection element in a signal generation system which comprises a first signal source and a second signal source which can receive and transmit a signal, a reflection element which can be connected respectively to the first and second signal sources, and realizes a predetermined reflection state, and a transmission element which comprises a first terminal and a second terminal, and has a transmission characteristic for a direction from the first terminal to the second terminal and a transmission characteristic for a direction from the second terminal to the first terminal which are equal to each other, said element determination process comprising:

deriving error factors in the first signal source and the second signal source based on a measurement result of a signal in respective states in which the reflection element is respectively connected to the first signal source and the second signal source, and a measurement result of a signal in a state in which the first terminal and the second terminal of the transmission element are respectively connected to the first signal source and the second signal source;

deriving a transmission characteristic of the transmission element based on a measurement result of a signal in the state in which the first terminal and the second terminal of the transmission element are respectively connected to the first signal source and the second signal source and the derived error factors; and determining whether the reflection element realizes the predetermined reflection state by comparing the derived transmission characteristic of the transmission element with a transmission characteristic of the transmission element known before the transmission characteristic derivation.

12. An element determination method for determining a state of a reflection element and a transmission element in a signal generation system which comprises a first signal source and a second signal source which can receive and transmit a signal, a reflection element which can be connected respectively to the first and second signal sources, and realizes a predetermined reflection state, and a transmission element which realizes a predetermined transmission state, comprises a first terminal and a second terminal, and has a transmission characteristic for a direction from the first terminal to the second terminal and a transmission characteristic for a direction from the second terminal to the first terminal which are equal to each other, the element determination method comprising:

deriving error factors in the first signal source and the second signal source based on a measurement result of a signal in respective states in which the reflection element is respectively connected to the first signal source and the second signal source, and a measurement result of a signal in a state in which the first terminal and the second terminal of the transmission element are respectively connected to the first signal source and the second signal source;

deriving a transmission characteristic of the transmission element based on a measurement result of a signal in the state in which the first terminal and the second terminal of the transmission element are respectively connected to the first signal source and the second signal source and the derived error factors; and determining whether the reflection element realizes the predetermined reflection state and whether the transmission element realizes the predetermined transmission state by comparing the derived transmission characteristic of the transmission element with a transmission characteristic of the transmission element known before the transmission characteristic derivation.

13. A non-transitroy computer-readable medium having a program of instructions for execution by a computer to perform an element determination process for determining a state of a reflection element and a transmission element in a signal generation system which comprises a first signal source and a second signal source which can receive and transmit a signal, a reflection element which can be connected respectively to the first and second signal sources, and realizes a predetermined reflection state, and a transmission element which realizes a predetermined transmission state, comprises a first terminal and a second terminal, and has a transmission characteristic for a direction from the first terminal to the second terminal and a transmission characteristic for a direction from the second terminal to the first terminal which are equal to each other, said element determination process comprising:

deriving error factors in the first signal source and the second signal source based on a measurement result of a signal in respective states in which the reflection element is respectively connected to the first signal source and the second signal source, and a measurement result of a signal in a state in which the first terminal and the second terminal of the transmission element are respectively connected to the first signal source and the second signal source;

deriving a transmission characteristic of the transmission element based on a measurement result of a signal in the state in which the first terminal and the second terminal of the transmission element are respectively connected to the first signal source and the second signal source and the derived error factors; and determining whether the reflection element realizes the predetermined reflection state and whether the transmission element realizes the predetermined transmission state by comparing the derived transmission characteristic of the transmission element with a transmission characteristic of the transmission element known before the transmission characteristic derivation.

* * * * *

UNITED STATES PATENT AND TRADEMARK OFFICE
CERTIFICATE OF CORRECTION

PATENT NO.         : 8,203,347 B2
APPLICATION NO.    : 12/377791
DATED              : June 19, 2012
INVENTOR(S)        : Y. Nakayama et al.

It is certified that error appears in the above-identified patent and that said Letters Patent is hereby corrected as shown below:

At column 28, line 35 (claim 6, line 35) of the printed patent, please delete "and" before "with".

Signed and Sealed this
Eleventh Day of September, 2012

David J. Kappos
*Director of the United States Patent and Trademark Office*